(12) United States Patent
Hsueh et al.

(10) Patent No.: US 12,550,721 B2
(45) Date of Patent: Feb. 10, 2026

(54) INTER-WIRE CAVITY FOR LOW CAPACITANCE

(71) Applicant: Taiwan Semiconductor Manufacturing Company, Ltd., Hsin-Chu (TW)

(72) Inventors: Hsiu-Wen Hsueh, Taichung (TW); Jiing-Feng Yang, Zhubei (TW); Chii-Ping Chen, Hsinchu (TW); Po-Hsiang Huang, Taipei (TW); Chang-Wen Chen, Hsin-Chu (TW); Cai-Ling Wu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 836 days.

(21) Appl. No.: 17/873,381

(22) Filed: Jul. 26, 2022

(65) Prior Publication Data

US 2022/0359266 A1 Nov. 10, 2022

Related U.S. Application Data

(62) Division of application No. 17/029,213, filed on Sep. 23, 2020, now Pat. No. 11,551,968.
(Continued)

(51) Int. Cl.
*H01L 21/768* (2006.01)
*H01L 23/48* (2006.01)
(Continued)

(52) U.S. Cl.
CPC .... *H01L 21/7682* (2013.01); *H01L 21/76802* (2013.01); *H01L 21/7684* (2013.01);
(Continued)

(58) Field of Classification Search
CPC .......... H01L 21/7684; H01L 21/76846; H01L 21/76849; H01L 21/76877
See application file for complete search history.

(56) References Cited

U.S. PATENT DOCUMENTS 10,164,046 B2 12/2018 Chang et al.
10,685,873 B2 6/2020 Tung et al.
(Continued)

FOREIGN PATENT DOCUMENTS

KR 20070022869 A 2/2007

OTHER PUBLICATIONS

Notice of Allowance dated Aug. 17, 2022 for U.S. Appl. No. 17/029,213.
(Continued)

*Primary Examiner* — Zandra V Smith
*Assistant Examiner* — John M Parker
(74) *Attorney, Agent, or Firm* — Eschweiler & Potashnik, LLC

(57) ABSTRACT

Various embodiments of the present disclosure are directed towards an integrated circuit (IC) in which cavities separate wires of an interconnect structure. For example, a conductive feature overlies a substrate, and an intermetal dielectric (IMD) layer overlies the conductive feature. A first wire and a second wire neighbor in the IMD layer and respectively have a first sidewall and a second sidewall that face each other while being separated from each other by the IMD layer. Further, the first wire overlies and borders the conductive feature. A first cavity and a second cavity further separate the first and second sidewalls from each other. The first cavity separates the first sidewall from the IMD layer, and the second cavity separates the second sidewall from the IMD layer. The cavities reduce parasitic capacitance
(Continued)

between the first and second wires and hence resistance-capacitance (RC) delay that degrades IC performance.

20 Claims, 25 Drawing Sheets

Related U.S. Application Data

(60) Provisional application No. 63/014,904, filed on Apr. 24, 2020.

(51) Int. Cl.
*H01L 23/522* (2006.01)
*H01L 23/532* (2006.01)

(52) U.S. Cl.
CPC .. *H01L 21/76846* (2013.01); *H01L 21/76849* (2013.01); *H01L 21/76877* (2013.01); *H01L 23/481* (2013.01); *H01L 23/5226* (2013.01); *H01L 23/53238* (2013.01); *H01L 23/5329* (2013.01)

(56) References Cited

U.S. PATENT DOCUMENTS

| | | |
|---|---|---|
| 11,183,577 B2 | 11/2021 | Cheng et al. |
| 2007/0178713 A1 | 8/2007 | Jeng |
| 2012/0104512 A1 | 5/2012 | Horak et al. |
| 2015/0014759 A1 | 1/2015 | Lee et al. |
| 2015/0179499 A1 | 6/2015 | Yang et al. |
| 2015/0243544 A1 | 8/2015 | Alptekin et al. |
| 2016/0093668 A1* | 3/2016 | Lu .................. H01L 23/528 257/421 |
| 2016/0365426 A1 | 12/2016 | Ching et al. |
| 2017/0179242 A1 | 6/2017 | Chang et al. |
| 2019/0006416 A1 | 1/2019 | Lee et al. |
| 2019/0109203 A1 | 4/2019 | Chang et al. |
| 2019/0122931 A1 | 4/2019 | Huang et al. |
| 2019/0252319 A1 | 8/2019 | Yang et al. |

OTHER PUBLICATIONS

Non-Final Office Action dated Apr. 1, 2022 for U.S. Appl. No. 17/029,213.

* cited by examiner

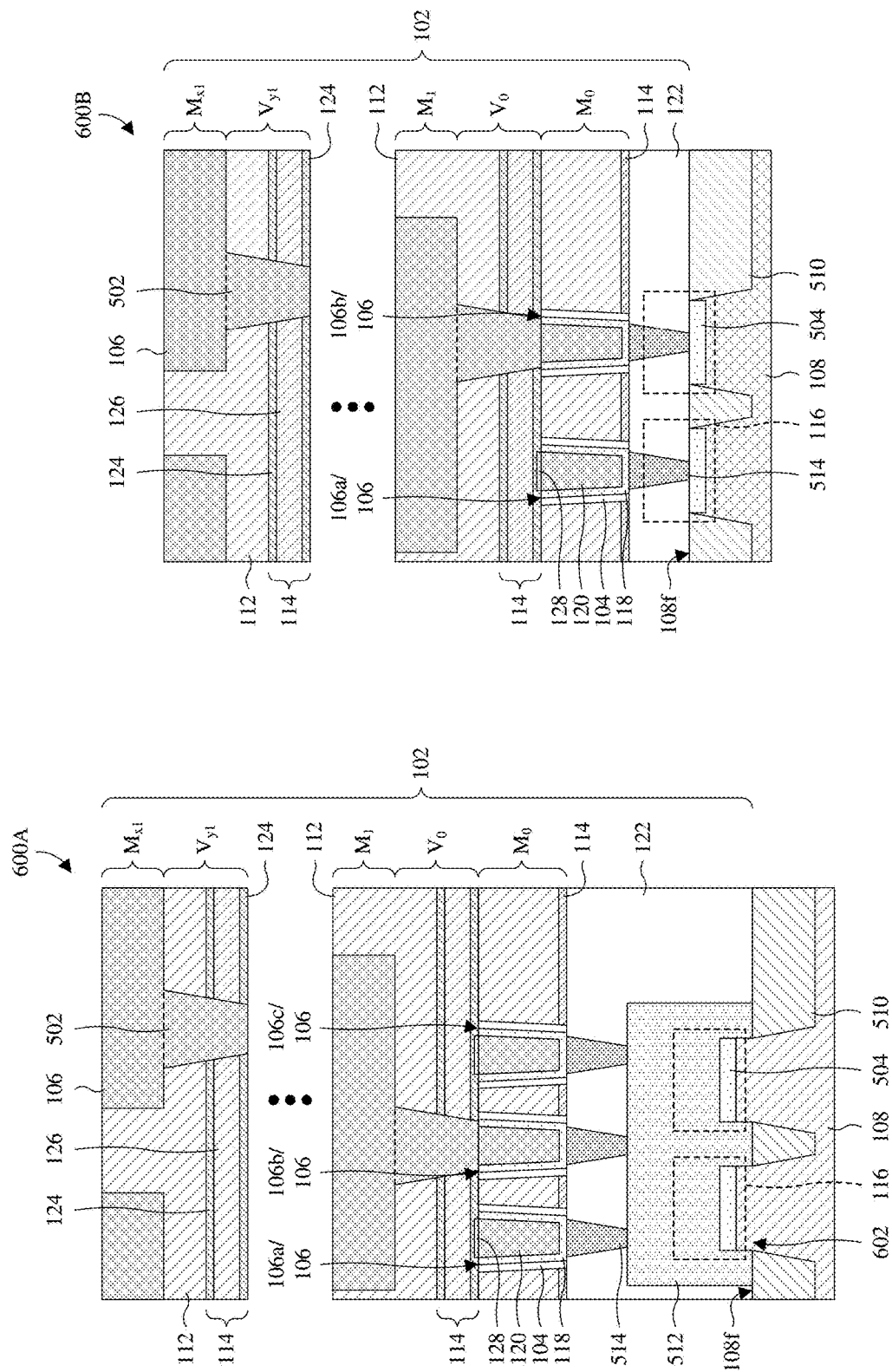

INTER-WIRE CAVITY FOR LOW CAPACITANCE

REFERENCE TO RELATED APPLICATIONS

This Application is a Divisional of U.S. application Ser. No. 17/029,213, filed on Sep. 23, 2020, which claims the benefit of U.S. Provisional Application No. 63/014,904, filed on Apr. 24, 2020. The contents of the above-referenced Patent Applications are hereby incorporated by reference in their entirety.

BACKGROUND

An integrated circuit (IC) includes semiconductor devices and an interconnect structure electrically coupled to the semiconductor devices. The interconnect structure comprises a plurality of conductive features grouped into multiple levels and stacked to define conductive paths interconnecting the semiconductor devices. The plurality of conductive features may, for example, comprise contacts, wires, and vias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6D illustrate cross-sectional views of some different alternative embodiments of the IC of FIG. 5A in which the interconnect structure is varied and/or semiconductor devices are varied.

DETAILED DESCRIPTION

Figure 1:
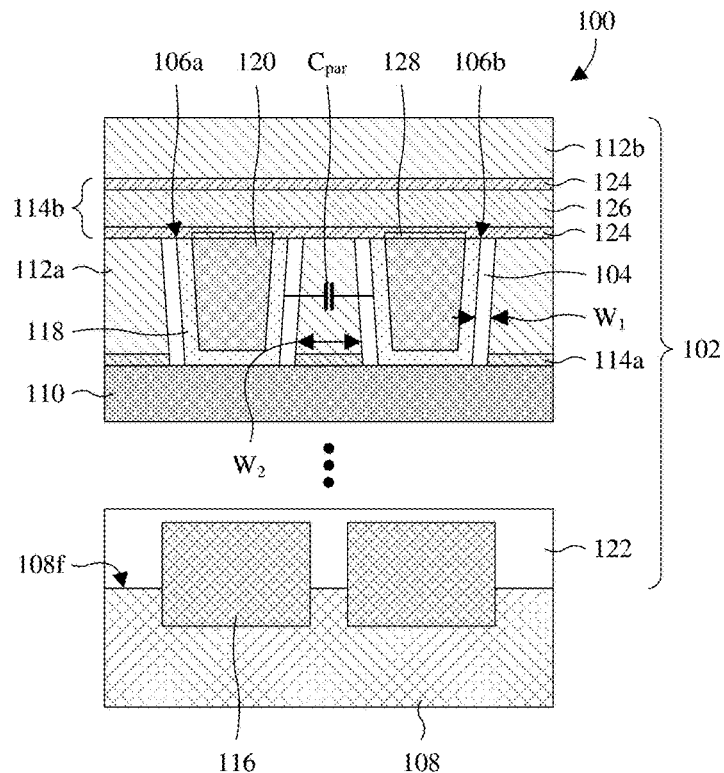
FIG. 1 illustrates a cross-sectional view of some embodiments of an integrated circuit (IC) comprising an interconnect structure in which cavities separate a plurality of wires.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated circuit (IC) may comprise a plurality of semiconductor devices and an interconnect structure. The semiconductor devices are on a substrate, and the interconnect structure overlies and electrically couples to the semiconductor devices to define conductive paths interconnecting the semiconductor devices. The interconnect structure comprises a plurality of wires and a plurality of vias. The wires and the vias are grouped respectively into wire levels and via levels that are alternatingly stacked over the semiconductor devices. A wire level closest to the semiconductor devices comprises a first wire and a second wire neighboring and separated by a dielectric layer. The dielectric layer individually surrounds the first and second wires and extends from the first wire to the second wire.

Because the first and second wires neighbor, parasitic capacitance develops between the first and second wires. The parasitic capacitance is inversely proportional to the separation between the first and second wires and leads to resistance-capacitance (RC) delay that degrades performance of the IC. While the RC delay is negligible when the separation between the first and second wires is large, the IC manufacturing industry continuously seeks to scale down ICs and scaling has reached, or is beginning, to reach a point where the separation is small enough, and hence the RC delay is large enough, to meaningfully degrade performance of the IC. Further, as ICs continue to scale down, this is only expected to become worse.

Various embodiments of the present disclosure are directed towards an IC in which cavities separate wires of an interconnect structure, as well as a method for forming the IC. In some embodiments of the IC, a conductive feature overlies a substrate and an intermetal dielectric (IMD) layer overlies the conductive feature. A first wire and a second wire neighbor in the IMD layer and respectively have a first sidewall and a second sidewall that face while being separated by the IMD layer. Further, the first wire overlies and adjoins the conductive feature. A first cavity and a second cavity further separate the first and second sidewalls. The first cavity separates the first sidewall from the IMD layer, and the second cavity separates the second sidewall from the IMD layer. Further, the first and second cavities are electrically insulating and have a smaller dielectric constant than the IMD layer.

Because the first and second cavities have a smaller dielectric constant than the IMD layer, the first and second cavities may reduce an overall dielectric constant between the first and second sidewalls. This may, in turn, reduce parasitic capacitance that develops between the first and second wires and may, in turn, counteract an increase in the parasitic capacitance from scaling down of the IC. By reducing the parasitic capacitance, RC delay that degrades performance of the IC may be reduced, such that the IC may have high performance.

With reference to FIG. 1, a cross-sectional view 100 of some embodiments of an IC comprising an interconnect structure 102 is provided in which a plurality of cavities 104 separate a first wire 106a and a second wire 106b neighboring on a frontside 108f of a substrate 108. The first and second wires 106a, 106b overlie a conductive feature 110 and are at a common elevation above the substrate 108. Further, the first and second wires 106a, 106b are within a first IMD layer 112a and a first etch stop layer (ESL) 114a and are further separated by the first IMD layer 112a and the first ESL 114a. In some embodiments, top surfaces of the first and second wires 106a, 106b are even with or about even with a top surface of the first IMD layer 112a, and/or bottom surfaces of the first and second wires 106a, 106b are even with or about even with a bottom surface of the first ESL 114a.

The cavities 104 are electrically insulating and have a lower dielectric constant than the first IMD layer 112a and, in some embodiments, the first ESL 114a. Further, the cavities 104 are filled with a gas. In some embodiments, the cavities 104 are filled with air, such that the cavities 104 have a dielectric constant of about 1. In other embodiments, the cavities 104 are filled with one or more other suitable gases and/or combinations of air and one or more other suitable gases. In some embodiments, the cavities 104 are hermetically sealed. In some embodiments, a width $W_1$ of the cavities 104 is about 15 angstroms, about 10-20 angstroms, or some other suitable value, and/or a width $W_2$ of the first IMD layer 112a between the first and second wires is about 5 nanometers, about 1-10 nanometers, or some other suitable value. The first IMD layer 112a may, for example, be or comprise oxide and/or some other suitable material(s). In some embodiments, the first IMD layer 112a is an extreme low k (ELK) dielectric having a dielectric constant less than about 2 or some other suitable value. In other embodiments, the first IMD layer 112a is a low k dielectric, but not an ELK dielectric, and hence has a dielectric constant of about 2-3.9 or some other suitable value.

Because the first and second wires 106a, 106b neighbor, parasitic capacitance $C_{par}$ develops between the first and second wires 106a, 106b. Further, because the cavities 104 have a smaller dielectric constant than the first IMD layer 112a, the cavities 104 reduce an overall dielectric constant between the first and second wires 106a, 106b. This, in turn, reduces the parasitic capacitance $C_{par}$ and counteracts an increase in the parasitic capacitance $C_{par}$ from scaling down of the IC. In some embodiments, the parasitic capacitance is reduced by about 13-16 percent. However, other suitable percentages are amenable in other embodiments.

Because the parasitic capacitance $C_{par}$ is reduced, RC delay is reduced. RC delay degrades performance of the IC, such that reducing RC delay may increase performance of the IC. For example, a plurality of semiconductor devices 116 on the substrate 108 may switch between conducting and non-conducting states depending on control signals passing through the first and second wires 106a, 106b, such that the reduced RC delay may increase switching speed. In some embodiments, the reduced RC delay may increase switching speed by about 1 percent or more. However, other suitable percentages are amenable in other embodiments.

With continued reference to FIG. 1, the first and second wires 106a, 106b include individual barrier liners 118 and individual plugs 120. In alternative embodiments, the barrier liners 118 are omitted. The barrier liners 118 cup undersides of the plugs 120 to separate the plugs 120 from the cavities 104 and the conductive feature 110. Further, the barrier liners 118 prevent outward diffusion of material from the plugs 120 to surrounding structure. The barrier liners 118 may, for example, be or comprise tantalum nitride, titanium nitride, some other suitable barrier material, or any combination of the foregoing, and/or the plugs 120 may, for example, be or comprise copper, aluminum copper, aluminum, some other suitable metal(s) and/or conductive material(s), or any combination of the foregoing.

The conductive feature 110 is between the semiconductor devices 116 and the first and second wires 106a, 106b. Further, the conductive feature 110 is electrically coupled to the semiconductor devices 116 and/or the substrate 108 by intervening structure, which is not shown but is schematically represented by the ellipsis. The conductive feature 110 may, for example, be or comprise a contact or some other suitable type of conductive feature. The conductive feature 110 may, for example, be or comprise tungsten and/or some other suitable conductive material(s). In some embodiments, the conductive feature 110 is metal.

The semiconductor devices 116 overlie, and are partially defined by, the substrate 108. Further, the semiconductor devices 116 are covered by and separated from the conductive feature 110 by an interlayer dielectric (ILD) layer 122. The semiconductor devices 116 may, for example, be metal-oxide-semiconductor field-effector transistors (MOSFETs), fin field-effect transistors (finFETs), gate-all-around field-effect transistors (GAA FETs), some other suitable type of semiconductor device, or any combination of the foregoing. The substrate 108 may, for example, be a bulk substrate of monocrystalline silicon, a silicon-on-insulator (SOI) substrate, or some other suitable type of semiconductor substrate. The ILD layer 122 may, for example, be or comprise silicon oxide and/or some other suitable dielectric(s).

A second IMD layer 112b and a second ESL 114b are stacked over the first and second wires 106a, 106b, such that the second ESL 114b is between the second IMD layer 112b and the first and second wires 106a, 106b. As will be seen hereafter, the second IMD layer 112b and the second ESL 114b may, for example, accommodate vias and/or additional wires electrically coupled to the first and/or second wire(s) 106a, 106b. The second IMD layer 112b is as the first IMD layer 112a is described and may, for example, be or comprise oxide and/or some other suitable material(s). The second ESL 114b may, for example, be or comprise silicon oxide, silicon nitride, some other suitable dielectric(s), or any combination of the foregoing.

In some embodiments, the first ESL 114a has a single material throughout, whereas the second ESL 114b comprises multiple materials. For example, the first ESL 114a may be silicon nitride, silicon carbide, or some other suitable dielectric, whereas the second ESL 114b may be a nitride-oxide-nitride (NON) film or some other suitable multilayer film. In some embodiments, the second ESL 114b comprises a pair of outer layers 124 sharing a first material and further comprises an intermediate layer 126 between the outer layers 124 and having a second material. The first material may, for example, be or comprise silicon nitride or some other suitable material, whereas the second material may, for example, be or comprise silicon oxide or some other suitable material, or vice versa. Further, the first or second material may, for example, be the same as that of the first ESL 114a.

A plurality of wire caps 128 separate the first and second wires 106a, 106b from the second ESL 114b and are localized on the plugs 120. In alternative embodiments, the wire caps 128 are omitted and/or are also on the barrier liners 118. The wire caps 128 are conductive and are individual to the first and second wires 106a, 106b. Further, the wire caps 128 reduce a resistance from the first and second wires 106a, 106b to conductive features (not shown) overlying and electrically coupled to the first and second wires. The wire caps 128 may, for example, be or comprise cobalt and/or some other suitable metal(s).

Figure 2:
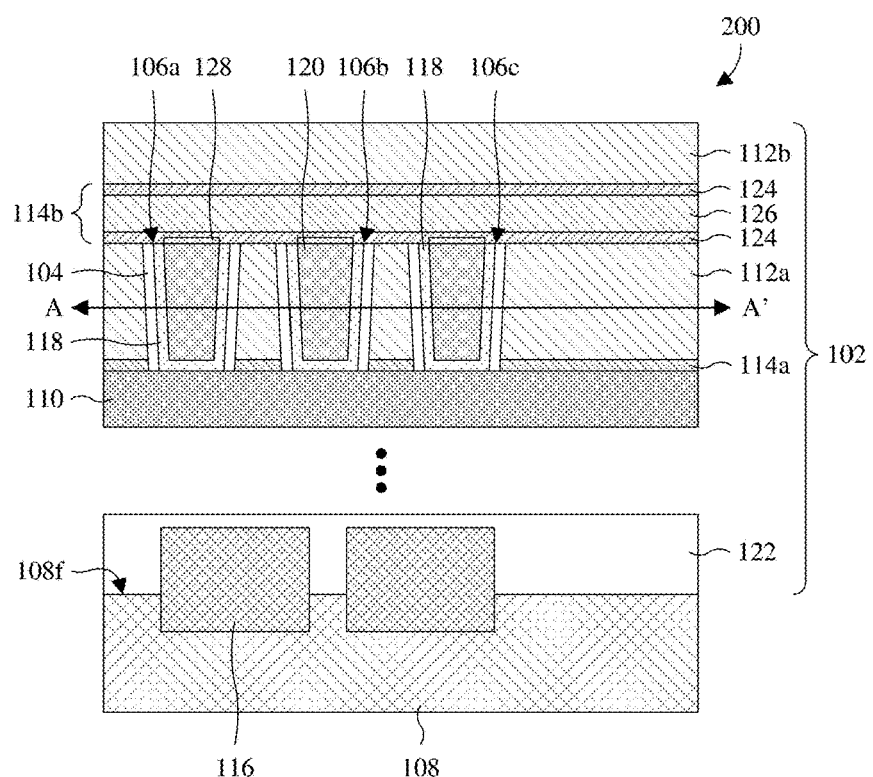
FIG. 2 illustrates a cross-sectional view of some alternative embodiments of the IC of FIG. 1 in which the plurality of wires comprises an additional wire.

With reference to FIG. 2, a cross-sectional view 200 of some embodiments of the IC of FIG. 1 is provided in which the cavities 104 further separate the second wire 106b from a third wire 106c that neighbors the second wire 106b at a common elevation above the substrate 108. The third wire 106c is as the first and second wires 106a, 106b are described, and the cavities 104 reduce parasitic capacitance between the second and third wires 106b, 106c as described above for the parasitic capacitance between the first and second wires 106a, 106b.

Figure 3A:
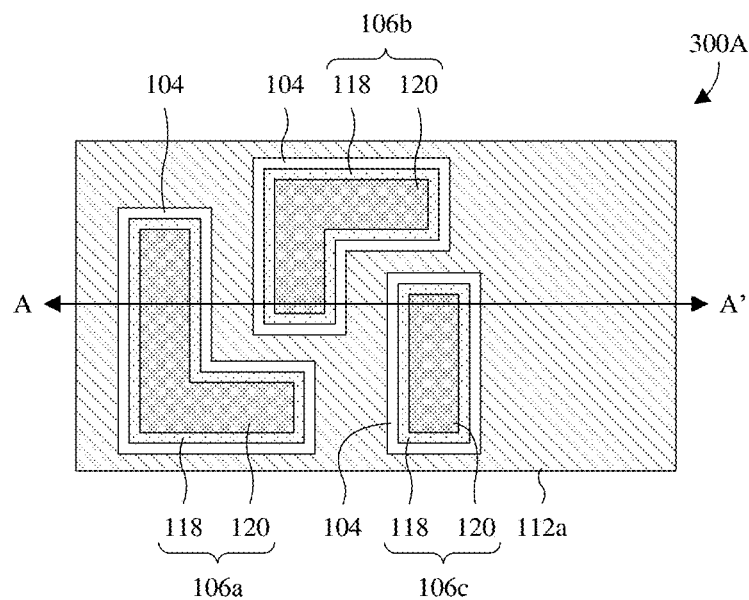
FIGS. 3A and 3B illustrate layout views of some different embodiments of the IC of FIG. 2.
Figure 3B:
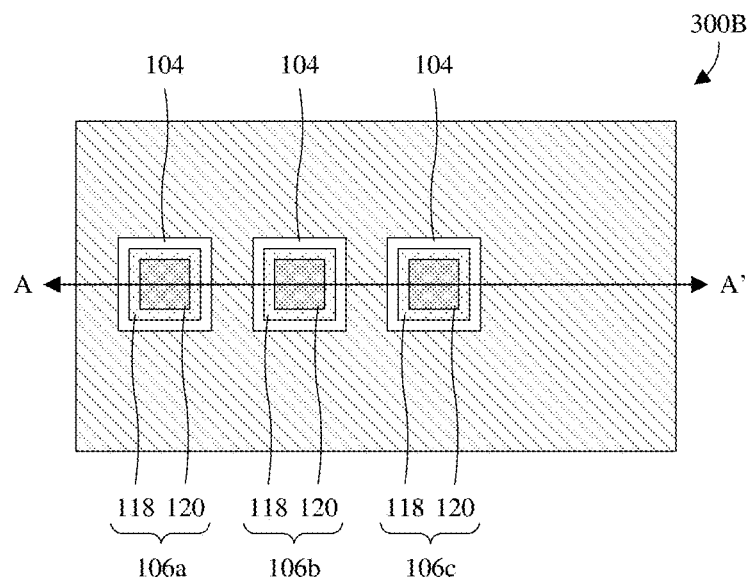

With reference to FIGS. 3A and 3B, layout views 300A, 300B of some different embodiments of the IC of FIG. 2 are provided. The layout views 300A, 300B of FIGS. 3A and 3B may, for example, be taken along line A-A' in FIG. 2, whereas the cross-sectional view 200 of FIG. 2 may, for example, be taken along line A-A' in FIGS. 3A and 3B. Other suitable locations for line A-A' are, however, amenable in FIGS. 2, 3A, and 3B.

In FIGS. 3A and 3B, the cavities 104 are individual to the first, second, and third wires 106a-106c and extend in individual closed paths around the first, second, and third wires 106a-106c. In FIG. 3A, the first, second, and third wires 106a-106c are elongated, such that the first and second wires 106a, 106b respectively having an L-shaped layout and an inverted L-shaped layout. In FIG. 3B, the first, second, and third wires 106a-106c share a common layout having the same or substantially the same dimensions in orthogonal directions (e.g., X and Y directions). For example, the first, second, and third wires 106a-106c may share a square layout. In alternative embodiments, any one or combination of the first, second, and third wires 106a-106c may have some other suitable layout(s) in any one of FIGS. 3A and 3B. For example, the first, second, and third wires 106a-106c may share a circular layout, an oval-shaped layout, a rectangular layout, or some other suitable layout in alternative embodiments of FIG. 3B.

With reference to FIGS. 4A-4G, cross-sectional views 400A-400G of some different alternative embodiments of the IC of FIG. 2 are provided in which the interconnect structure 102 is varied.

Figure 4A:
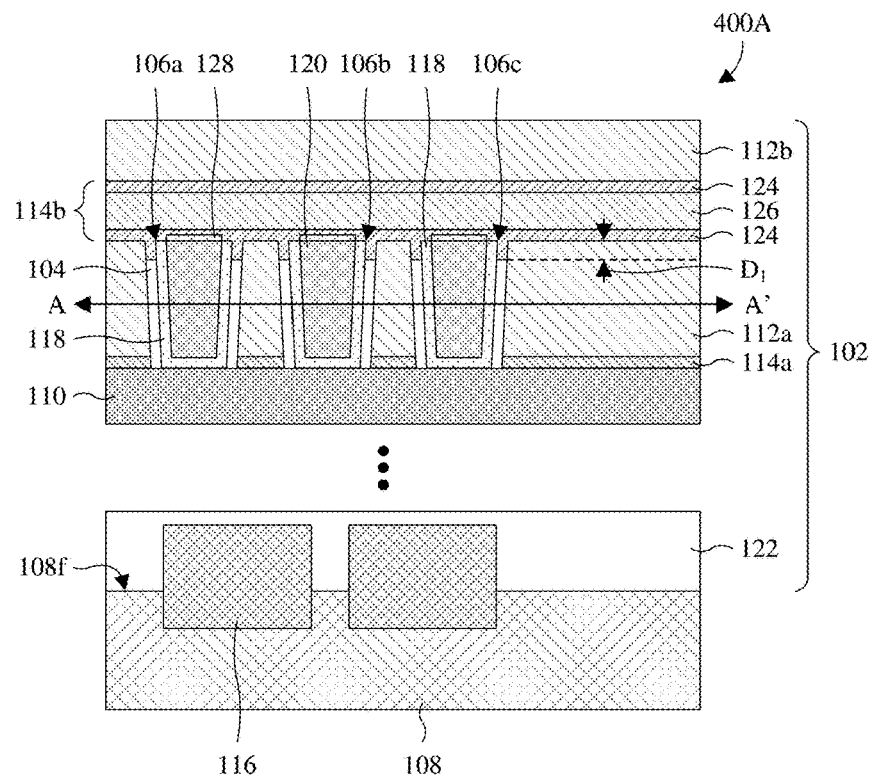
FIGS. 4A-4G illustrate cross-sectional views of some different alternative embodiments of the IC of FIG. 2 in which the interconnect structure is varied.

In FIG. 4A, the second ESL 114b protrudes into the cavities 104 by a distance Di. For example, to the extent that the second ESL 114b comprises the pair of outer layers 124 and the intermediate layer 126 between the outer layers 124, a bottom one of the outer layers 124 may protrude into the cavities 104 by the distance $D_1$. In some embodiments, the distance $D_1$ is about 15-25 angstroms, about 15-20 angstroms, about 20-25 angstroms, or about 20 angstroms. Other suitable values are, however, amenable for the distance $D_1$.

Figure 4B:
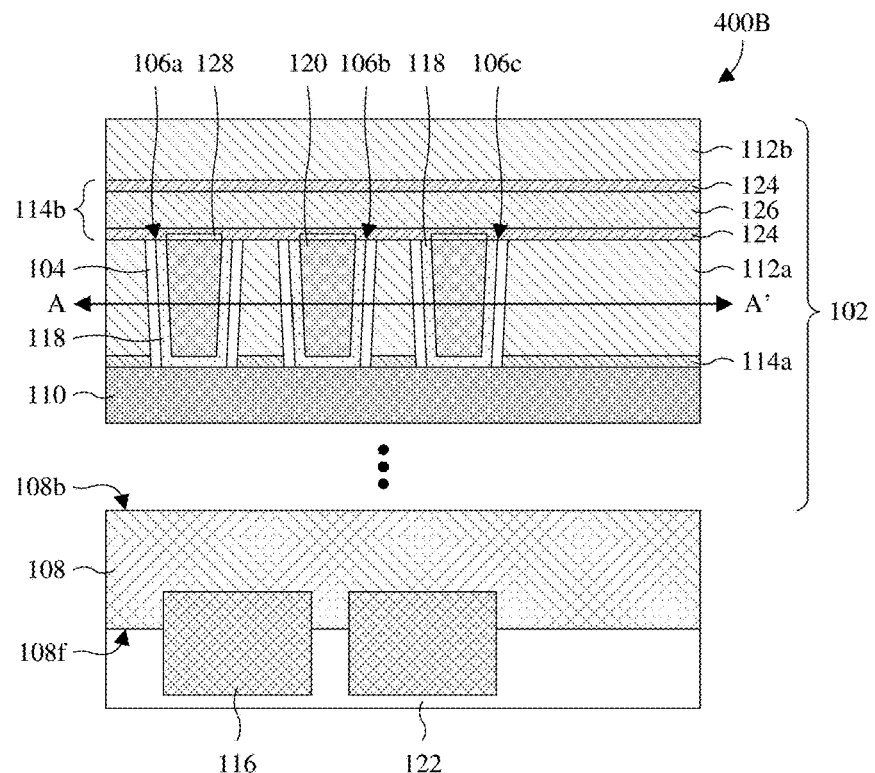

In FIG. 4B, the interconnect structure 102 is on an opposite side of the substrate 108 as the semiconductor devices 116 and is hence on a backside 108b of the substrate 108. As should be appreciated, the interconnect structure 102 has thus far been illustrated on a frontside 108f of the substrate 108. Further, the ILD layer 122 continues to cover the semiconductor devices 116 on the frontside 108f of the substrate 108.

Figure 4C:
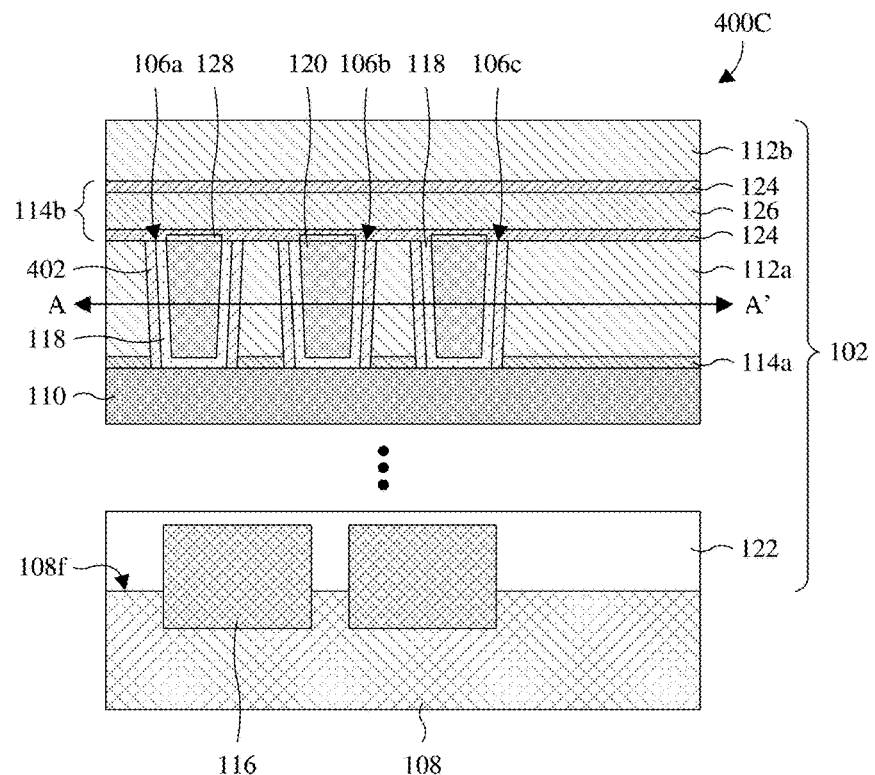
Figure 4D:
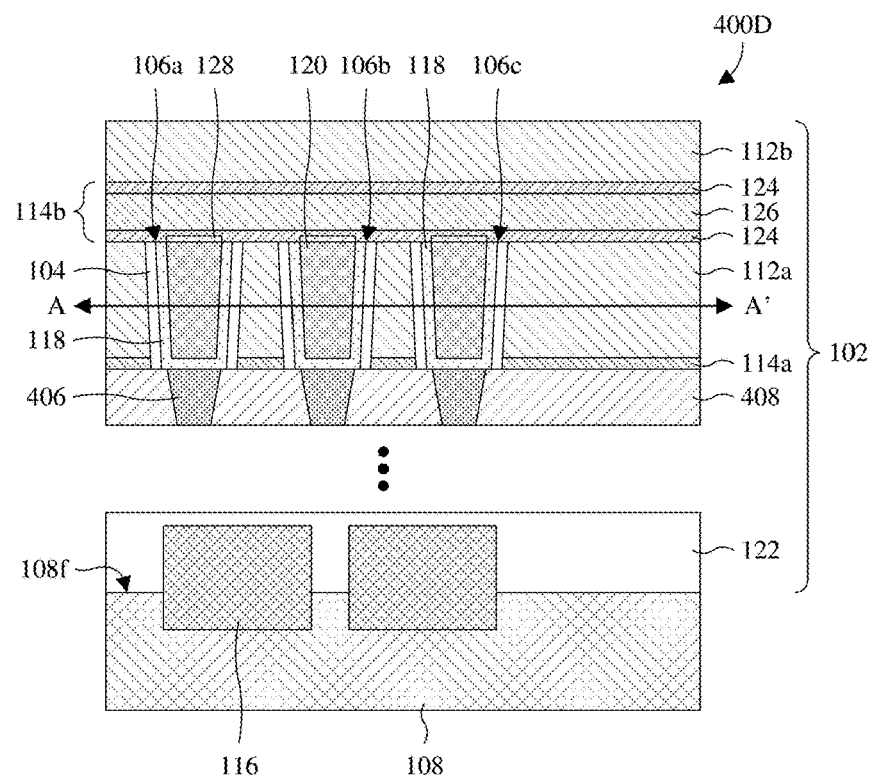

In FIG. 4C, the cavities 104 are filled with a cavity-fill dielectric layer 402 that has a smaller dielectric constant than the first IMD layer 112a. The cavity-fill dielectric layer 402 may, for example, be or comprise titanium oxide (e.g., TiO), hafnium oxide (e.g., HfO), silicon carbide (e.g., SiC), silicon oxide (e.g., SiO), silicon oxycarbide (e.g., SiOC), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), some other suitable material(s), or any combination of the foregoing.

Because the cavity-fill dielectric layer 402 has a smaller dielectric constant than the first IMD layer 112a, the cavity-fill dielectric layer 402 reduces an overall dielectric constant between the first and second wires 106a, 106b. The same may also be said for the parasitic capacitance between the second and third wires 106b, 106c. This, in turn, reduces the parasitic capacitance between the first and second wires 106a, 106b and counteracts an increase in the parasitic capacitance from scaling down of the IC. Because the parasitic capacitance is reduced, RC delay is reduced. RC delay degrades performance of the IC, such that the reduced RC delay may increase the performance of the IC In FIG. 4D, the conductive feature 110 is replaced with a plurality of conductive features 406 individual to and respectively underlying the first, second, and third wires 106a-106c. The conductive features 406 are electrically coupled to the semiconductor devices 116 and/or the substrate 108 by underlying structure, which is not shown but is schematically represented by the ellipsis. The conductive features 406 are in a conductive-feature dielectric layer 408 and may, for example, be vias, contacts, or some other suitable type of conductive feature. Further, the conductive features 406 may, for example, be or comprise tungsten and/or some other suitable conductive material(s). In some embodiments, the conductive features 406 are metal. In some embodiments, the conductive-feature dielectric layer 408 is as the ILD layer 122 of FIG. 1 is described. In other embodiments, the conductive-feature dielectric layer 408 is as the first and/or second IMD layer(s) 112a, 112b of FIG. 1 is/are described.

Figure 4E:
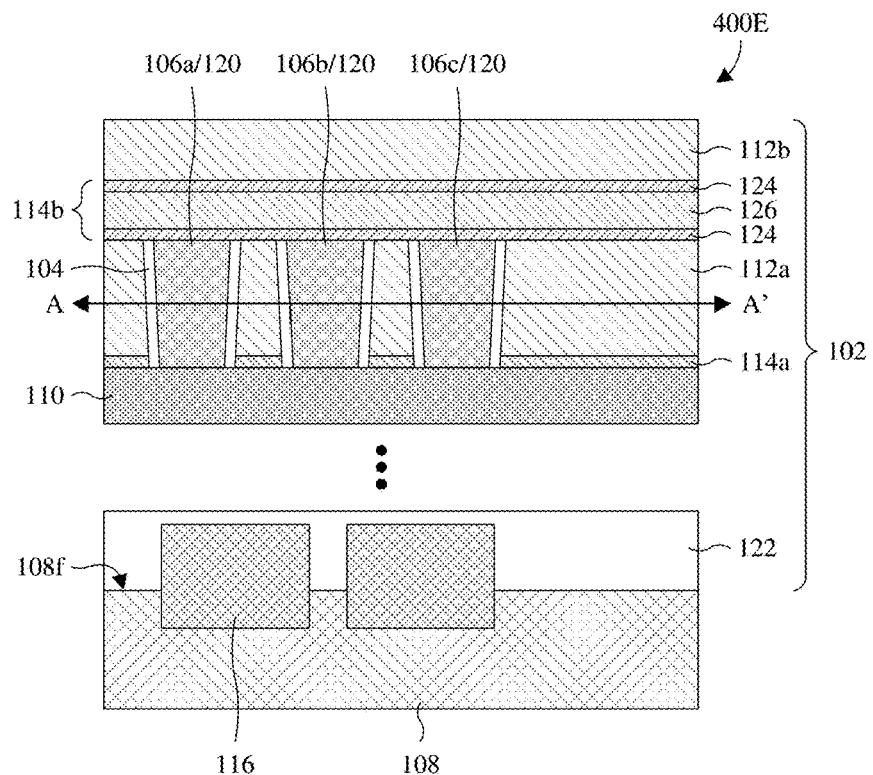

In FIG. 4E, the barrier liners 118 and the wire caps 128 are omitted. In alternative embodiments, the barrier liners 118 or the wire caps 128 persist.

Figure 4F:
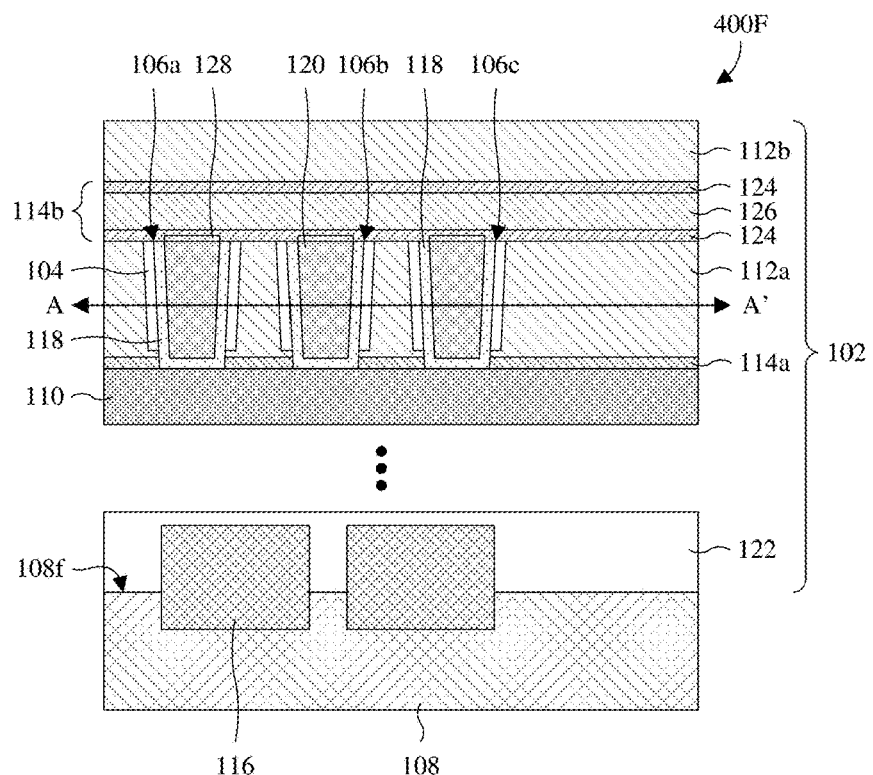

In FIG. 4F, the cavities 104 overlie a lower portion of the first IMD layer 112a and further overlie the first ESL 114a.

Figure 4G:
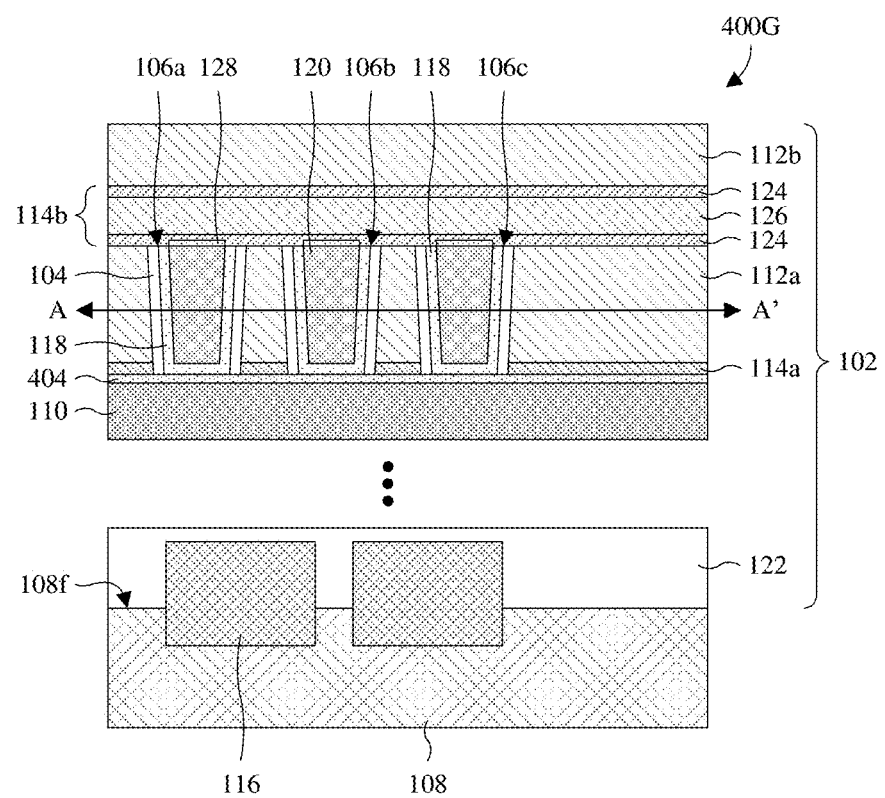

In FIG. 4G, a conductive-feature cap 404 separates the conductive feature 110 from the first, second, and third wires 106a-106c. The conductive-feature cap 404 is conductive and may, for example, be or comprise cobalt and/or some other suitable metal(s).

While FIGS. 3A and 3B are described with regard to FIG. 2, it is to be appreciated that FIGS. 3A and 3B are also applicable to FIGS. 4A-4G. For example, any of FIGS. 4A, 4B, and 4D-4G may be taken along line A-A' in FIGS. 3A and 3B. As another example, FIG. 4C may be taken along A-A' in alternative embodiments of FIGS. 3A and 3B in which the cavities 104 are filled with the cavity-fill dielectric layer 402.

Figure 5A:
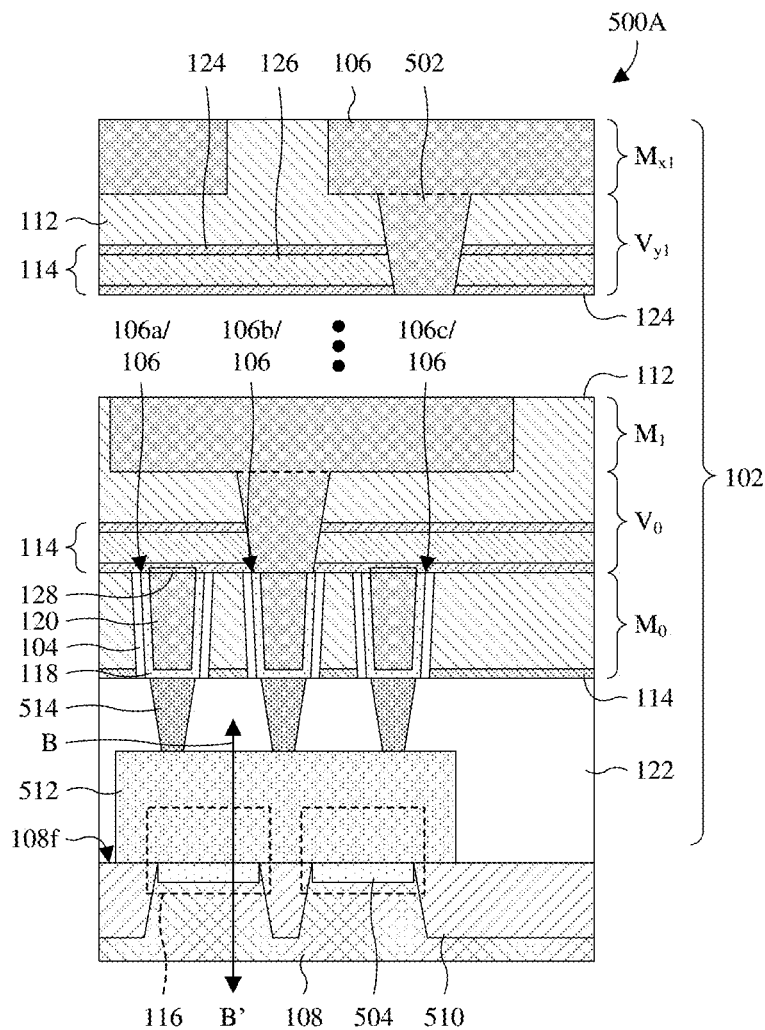
FIGS. 5A and 5B illustrate orthogonal cross-sectional views of some alternative embodiments of the IC of FIG. 2 in which the interconnect structure has multiple wire levels and only a zeroth wire level has the cavities.
Figure 5B:
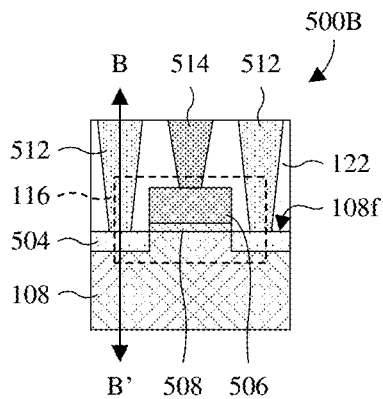

With reference to FIGS. 5A and 5B, orthogonal cross-sectional views 500A, 500B of some alternative embodiments of the IC of FIG. 2 are provided in which the interconnect structure 102 has multiple wire levels and only a zeroth wire level $M_0$ has the cavities 104. The cross-sectional view 500A of FIG. 5A may, for example, be taken along line B-B' in FIG. 5B, whereas the cross-sectional view 500B of FIG. 5B may, for example, be taken along line B-B' in FIG. 5A. Other suitable locations for line B-B' are, however, amenable in FIGS. 5A and 5B.

The interconnect structure 102 comprises a plurality of wires 106 and a plurality of inter-wire vias 502, and the plurality of wires 106 includes the first, second, and third wires 106a-106c. The wires 106 are grouped into a plurality of wire levels $M_0$-$M_{x1}$, where x1 corresponds to an integer greater than zero. Similarly, the inter-wire vias 502 are grouped into a plurality of via levels $V_0$-$V_{y1}$, where y is an integer greater than zero. In some embodiments, y1 is one less than x1 (e.g., y1=x1−1). The wires levels $M_0$-$M_{x1}$ and via levels $V_0$-$V_{y1}$ are alternatingly stacked and correspond to different elevations above the substrate 108. Further, only the zeroth wire level $M_0$ has the cavities 104. The cavities 104 separate the wires 106 in the zeroth wire level $M_0$ as described above (e.g., with regard to FIG. 1) to reduce parasitic capacitance. In alternative embodiments, one, some, or all of the one or more remaining wire levels has/have the cavities 104. In alternative embodiments, the zeroth wire level $M_0$ does not have the cavities 104, but the one or more remaining wire levels has/have the cavities 104.

The wires levels $M_0$-$M_{x1}$ and the via levels $V_0$-$V_{y1}$ are in a dielectric stack comprising a plurality of IMD layers 112 and a plurality of ESLs 114. The IMD layers 112 are alternatingly stacked with the ESLs 114 and are each as the first and second IMD layers 112a, 112b of FIG. 1 are described. The ESL 114 at the bottom of the zeroth wire level $M_0$ is as the first ESL 114a of FIG. 1 is described, and the remaining ESLs 114 are as the second ESL 114b of FIG. 1 is described. In alternative embodiments, the ESL 114 at the bottom of the zeroth wire level $M_0$ is as the second ESL 114b of FIG. 1 is described or has some other suitable configuration. In alternative embodiments, one, some, or all of the remaining ESLs 114 is/are as the first ESL 114a of FIG. 1 is described or has/have some other suitable configuration.

The semiconductor devices 116 comprise corresponding source/drain regions 504, corresponding gate electrodes 506, and corresponding gate dielectric layers 508. Note that only some of the source/drain regions 504 are visible, only one of the gate electrodes 506 is visible, and only one of the gate dielectric layers 508 is visible. The gate dielectric layers 508 respectively separate the gate electrodes 506 from the substrate 108, and gate electrodes 506 are each sandwiched between two of the source/drain regions 504. The semiconductor devices 116 may, for example, be MOSFETs or some other suitable type of semiconductor device. In alternative embodiments, the semiconductor devices 116 are finFETs, GAA FETs, some other type of semiconductor device, or any combination of the foregoing.

A trench isolation structure 510 extends into the substrate 108 to separate the semiconductor devices 116 from each other. The trench isolation structure 510 is or comprises silicon oxide and/or some other suitable dielectric(s). Further, the trench isolation structure 510 may, for example, be a shallow trench isolation (STI) structure, a deep trench isolation (DTI) structure, or some other suitable type of trench isolation structure.

A plurality of active-region (AR) contacts 512 and a plurality of interlayer vias 514 underlie the zeroth wire level $M_0$, between the semiconductor devices 116 and the zeroth wire level $M_0$. Whereas a via generally has the same or similar X and Y dimensions when viewed top down, a contact is generally elongated in an X or Y dimension when viewed top down. As a result, the AR contacts 512 look similar to the interlayer via 514 in FIG. 5B but have different layouts when viewed top down. The AR contacts 512 are on the source/drain regions 504 of the semiconductor devices 116, and the interlayer vias 514 extend from the zeroth wire level $M_0$ respectively to at least one of the AR contact 512 and at least one of the gate electrodes 506. The AR contact 512 may, for example, be or comprise tungsten, cobalt, some other suitable metal(s), or any combination of the foregoing. The interlayer vias 514 may, for example, be or comprise tungsten, ruthenium, cobalt, some other suitable metal(s), or any combination of the foregoing.

With reference to FIGS. 6A-6D, cross-sectional views 600A-600D of some different alternative embodiments of the IC of FIG. 5A are provided.

In FIG. 6A, the semiconductor devices 116 are finFETs, such that the substrate 108 has fins 602. In alternative embodiments, the semiconductor devices 116 are GAA FETs and/or some other type of semiconductor device.

In FIG. 6B, the AR contact 512 and the third wire 106c are omitted. Further, the interlayer vias 514 extend from the zeroth wire level $M_0$ respectively to the semiconductor devices 116 and/or the substrate 108.

Figures 6C, 6D:
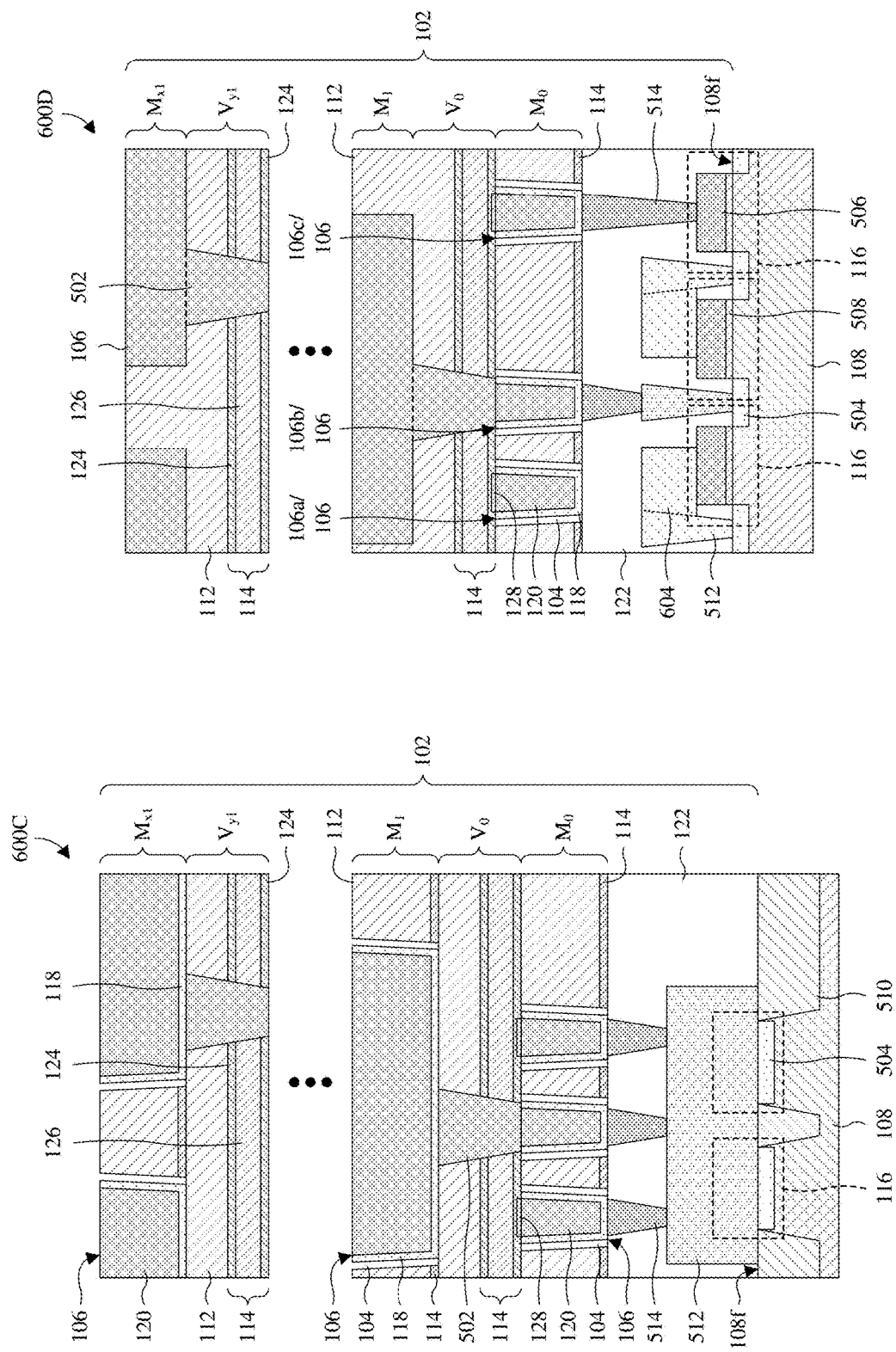

In FIG. 6C, the cavities 104 are at each of the wire levels $M_0$-$M_{x1}$ and the wires 106 at each of the wire levels $M_0$-$M_{x1}$ comprise individual barrier liners 118 and individual plugs 120. In alternative embodiments, the barrier liners 118 are omitted. Further, ESLs 114 are at the bottom of each wire levels $M_0$-$M_{x1}$. ESLs 114 at the bottoms of the wire levels $M_0$-$M_{x1}$ are as the first ESL 114a of FIG. 1 is described, and ESLs 114 at the bottom of the via levels $V_0$-$V_{y1}$ are as the second ESL 114b of FIG. 1 is described.

In FIG. 6D, the spacing of the first, second, and third wires 106a-106c is different. Further, the plurality of semiconductor devices 116 comprises an additional semiconductor device and the semiconductor devices 116 are oriented differently. As a result, the gate electrodes 506 and the gate dielectric layers 508 are within view and the trench isolation structure 510 is out of view. Similarly, the plurality of AR contacts 512 comprises an additional AR contact and the AR contacts 512 are oriented differently.

The interlayer vias 514 extends from the zeroth wire level $M_0$ correspondingly to at least one of the AR contacts 512 and at least one of the gate electrodes 506. Further, a plurality of gate contacts 604 electrically couple some of the AR contacts 512 respectively to some of the gate electrodes 506 to form so called butted contacts. In some embodiments, the gate contacts 604 are continuous with corresponding ones of the AR contacts 512. For example, the gate contacts 604 and the corresponding AR contacts may be formed from the same deposition, such that there may be no boundaries between the gate contacts 604 and the corresponding AR contacts. The AR contacts 512 are elongated in a first direction (e.g., into and out of the page), and the gate contacts 604 are elongated in a second direction (e.g., left and right on the page) transverse to the first direction. The gate contacts 604, for example, be or comprise tungsten, cobalt, some other suitable metal(s), or any combination of the foregoing.

Figure 7:
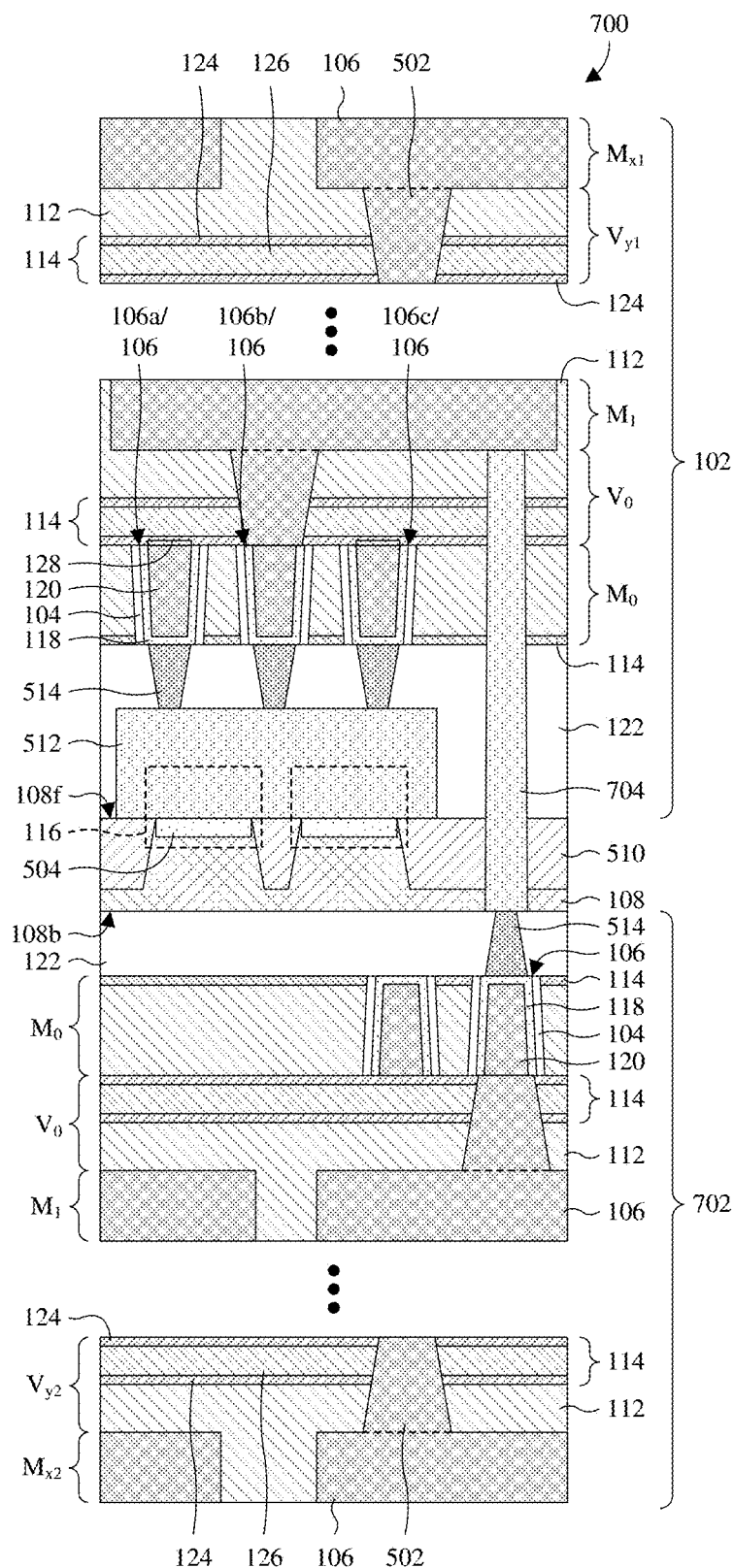
FIG. 7 illustrates a cross-sectional view of some alternative embodiments of the IC of FIG. 5A in which an additional interconnect structure is on a backside of the substrate and comprises cavities laterally separating neighboring wires.

With reference to FIG. 7, a cross-sectional view 700 of some alternative embodiments of the IC of FIG. 5A is provided in which an additional interconnect structure 702 is on a backside 108*b* of the substrate 108. The additional interconnect structure 702 is as the interconnect structure 102 is described, with a few exceptions. The additional interconnect structure 702 does not have AR contacts and has a different arrangement of wires 106 and inter-wire via 502. The wires 106 are grouped into a plurality of wire levels $M_0$-$M_{x2}$, where x2 is an integer and may be the same as or different than x1. The inter-wire vias 502 are grouped into a plurality of via levels $V_0$-$V_{y2}$, where y2 is an integer and may be the same as or different than y1. In some embodiments, y2 is one less than x2 (e.g., y2=x2−1).

Because the additional interconnect structure 702 is as the interconnect structure 102 is described, with the few exceptions noted above, the wires 106 in the zeroth wire level $M_0$ of the additional interconnect structure 702 are separated by the cavities 104. As explained with regard to FIG. 1, this reduces parasitic capacitance and hence reduces RC delay.

The additional interconnect structure 702 defines conductive paths on the backside 108*b* of the substrate 108 and is electrically coupled to the interconnect structure 102 by a through substrate via (TSV) 704 and, in some embodiments, one or more other TSVs. The TSV 704 extends through the substrate 108 and the ILD layer 122 of the interconnect structure 102, from the interlayer vias 514 of the additional interconnect structure 702 to the first wire level $M_1$ of the interconnect structure 102. In alternative embodiments, the TSV 704 extends to the zeroth wire level $M_0$ of the interconnect structure 102. The TSV 704 may, for example, be or comprise metal and/or some other suitable conductive material(s).

While FIGS. 4A, 4C, and 4E-4G describe variations to FIG. 2, it is to be appreciated that the variations and any combination of the variations are applicable to any of FIGS. 5A, 6A-6D, and 7. For example, the cavities 104 in any of FIGS. 5A, 6A-6D, and 7 may be partially filled by one or more of the ESLs 114 as described and illustrated with regard to FIG. 4A. As another example, the cavities 104 in any of FIGS. 5A, 6A-6D, and 7 may be filled by one or more cavity-fill dielectric layers 402 as described and illustrated with regard to FIG. 4C. As yet another example, the barrier liners 118 in any of FIGS. 5A, 6A-6D, and 7 may be omitted as described and illustrated with regard to FIG. 4E. While FIGS. 6A-6D describe variations to FIG. 5A, it is to be appreciated that the variations and any combination of the variations are applicable to FIG. 7. For example, the semiconductor devices 116 may have fins as described and illustrated with regard to FIG. 6A. As another example, the AR contacts 512 may be omitted as described and illustrated with regard to FIG. 6B. As yet another example, each of the wire levels $M_0$-$M_{x1}$ in the interconnect structure 102 and/or each of the wire levels $M_0$-$M_{x2}$ in the additional interconnect structure 702 may have the cavities 104 as described and illustrated in FIG. 6C.

With reference to FIGS. 8, 9, 10A-10F, 11A-11G, and 12-22, a series of cross-sectional views 800, 900, 1000A-1000F, 1100A-1100G, and 1200-2200 of some embodiments of a method for forming an IC comprising an interconnect structure is provided in which cavities separate a plurality of wires. The method is illustrated using the IC of FIG. 7 but may be employed to form other suitable ICs.

Figure 8:
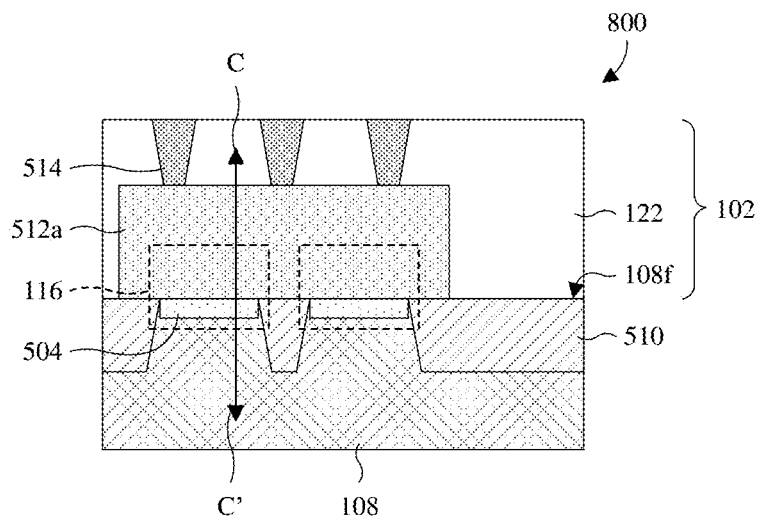
FIGS. 8, 9, 10A-10F, 11A-11G, and 12-22 illustrate a series of cross-sectional views of some embodiments of a method for forming an IC comprising an interconnect structure in which cavities separate a plurality of wires.

As illustrated by the cross-sectional view 800 of FIG. 8, a plurality of semiconductor devices 116 is formed overlying a substrate 108 on a frontside 108*f* of the substrate 108. The semiconductor devices 116 are separated by a trench isolation structure 510. Further, the semiconductor devices 116 comprise corresponding source/drain regions 504 (only some of which are visible) and corresponding gate stacks (not visible). The source/drain region 504 are grouped into pairs corresponding to the gate stacks and each of the gate stacks is sandwiched between the source/drain regions of a corresponding pair. In some embodiments, the semiconductor devices 116 each have cross-sectional profiles as in FIG. 5B in a direction orthogonal to the cross-sectional view 800 of FIG. 8. For example, FIG. 5B may be taken along line C-C'. The semiconductor devices 116 may, for example, be MOSFETs, finFETs, GAA FETs, some other suitable type of semiconductor device, or any combination of the foregoing.

Also illustrated by the cross-sectional view 800 of FIG. 8, an interconnect structure 102 is partially formed over and electrically coupled to the semiconductor devices 116. The interconnect structure 102 comprises a first AR contact 512*a* and a plurality of interlayer vias 514 in an ILD layer 122. The first AR contact 512*a* is laterally elongated and is on source/drain regions of the semiconductor devices 116 on a common side of the semiconductor devices 116. Further, the interlayer vias 514 overlie the first AR contact 512*a*. In alternative embodiments, the first AR contact 512*a* is omitted and the interlayer vias 514 extend from a top of the ILD layer 122 respectively to the semiconductor devices 116 as illustrated in FIG. 6B.

Figure 9:
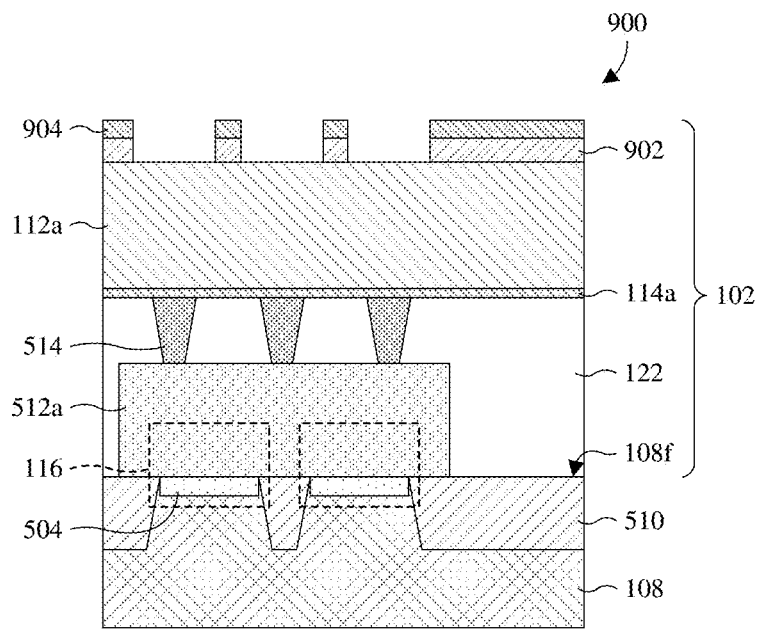

As illustrated by the cross-sectional view 900 of FIG. 9, a first ESL 114*a* and a first IMD layer 112*a* are deposited over the ILD layer 122 and the interlayer vias 514. The first IMD layer 112*a* overlies the first ESL 114*a* and may, for example, be or comprise oxide and/or some other suitable material(s). In some embodiments, the first IMD layer 112*a* is an ELK dielectric having a dielectric constant less than about 2 or some other suitable value. In other embodiments, the first IMD layer 112*a* is a low k dielectric, but is not an ELK dielectric, and hence has a dielectric constant of about 2-3.9 or some other suitable value. The first ESL 114*a* may, for example, be or comprise silicon nitride, silicon carbide, some other suitable dielectric(s), or any combination the foregoing.

Also illustrated by the cross-sectional view 900 of FIG. 9, a first hard mask layer 902 and a second hard mask layer 904 are formed over the first IMD layer 112*a* with a pattern for wires hereafter formed. The second hard mask layer 904 overlies the first hard mask layer 902 and may, for example, be or comprise tungsten doped carbon and/or some other suitable material(s). The first hard mask layer 902 may, for example, be or comprise tetraethyl ortho silicate (TEOS) oxide and/or some other suitable dielectric(s). A process for forming the first and second hard mask layers 902, 904 may, for example, comprise: 1) depositing the first hard mask layer 902 over the first IMD layer 112*a*; 2) depositing the second hard mask layer 904 over the first hard mask layer 902; and 3) patterning the first and second hard mask layers 902, 904 by a photolithography/etching process. In alternative embodiments, the first and second hard mask layers 902, 904 are formed by some other suitable process.

Figure 10A:
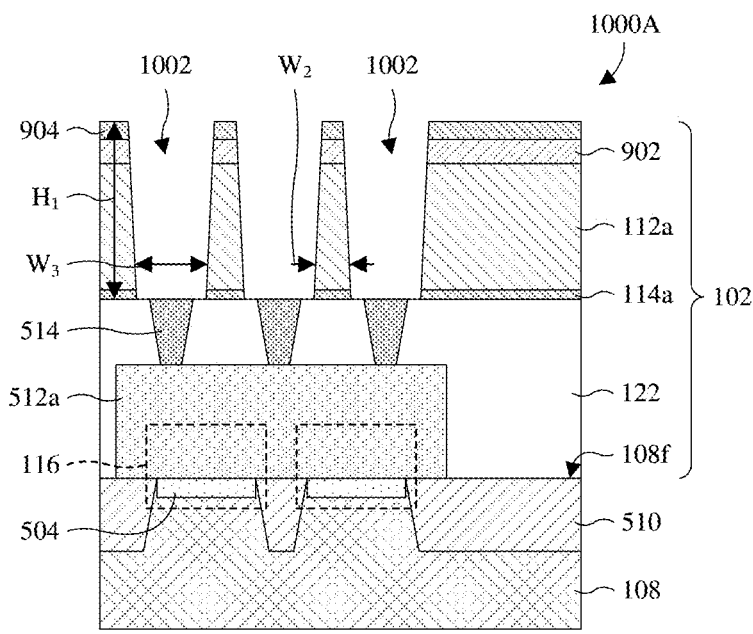

As illustrated by the cross-sectional view 1000A of FIG. 10A, the first IMD layer 112*a* and the first ESL 114*a* are etched with the first and second hard mask layers 902, 904 in place. The etching transfers a pattern of the first and second hard mask layers 902, 904 to the first IMD layer 112*a* and the first ESL 114*a* and further forms wire openings 1002 respectively overlying and exposing the interlayer vias 514. Further, the first ESL 114*a* serves as an etch stop to minimize over etching into the ILD layer 122. The etching may, for example, be performed by a dry etch, a wet etch, or some other suitable type of etch.

In some embodiments, the wire openings 1002 have a ratio of height $H_1$ to width $W_3$ (e.g., an aspect ratio) that is about 1.8-2.5, about 1.8-2.15, about 2.15-2.5, or some other suitable value. If the ratio is too high (e.g., above about 2.5 or some other value), a sacrificial layer hereafter described may not be fully removed (e.g., at FIG. 13). In some embodiments, the first IMD layer 112a has a width $W_2$ separating the wire openings 1002 for each neighboring pair of wire openings 1002. The width $W_2$ may, for example, be about 5 nanometers, about 1-10 nanometers, or some other suitable value.

Figure 10B:
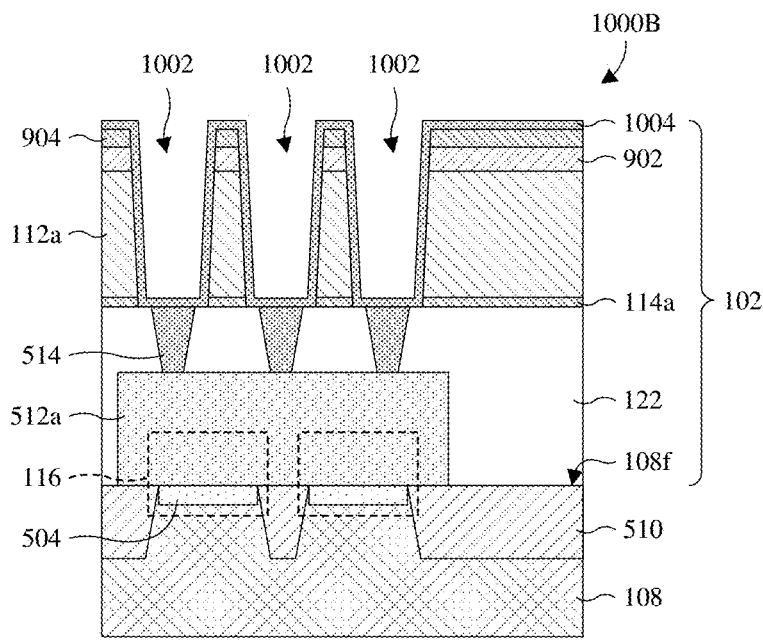

As illustrated by the cross-sectional view 1000B of FIG. 10B, a sacrificial layer 1004 is deposited lining the wire openings 1002 and covering the first and second hard mask layers 902, 904. The sacrificial layer 1004 may, for example, be or comprise titanium nitride (e.g., TiN), titanium oxide (e.g., TiO), titanium rich carbon (TRC), tungsten (e.g., W), tungsten doped carbon (e.g., WDC), hafnium oxide (e.g., HfO), zirconium oxide (e.g., ZrO), zinc oxide (e.g., ZnO), titanium zirconium oxide (e.g., TiZrO), silicon carbide (e.g., SiC), silicon oxide (e.g., SiO), silicon oxycarbide (e.g., SiOC), silicon nitride (e.g., SiN), silicon carbonitride (e.g., SiCN), silicon oxynitride (e.g., SiON), silicon oxycarbonitride (e.g., SiOCN), aluminum oxide (e.g., AlO), aluminum oxynitride (e.g., AlON), some other suitable material(s), or any combination of the foregoing.

Figure 10C:
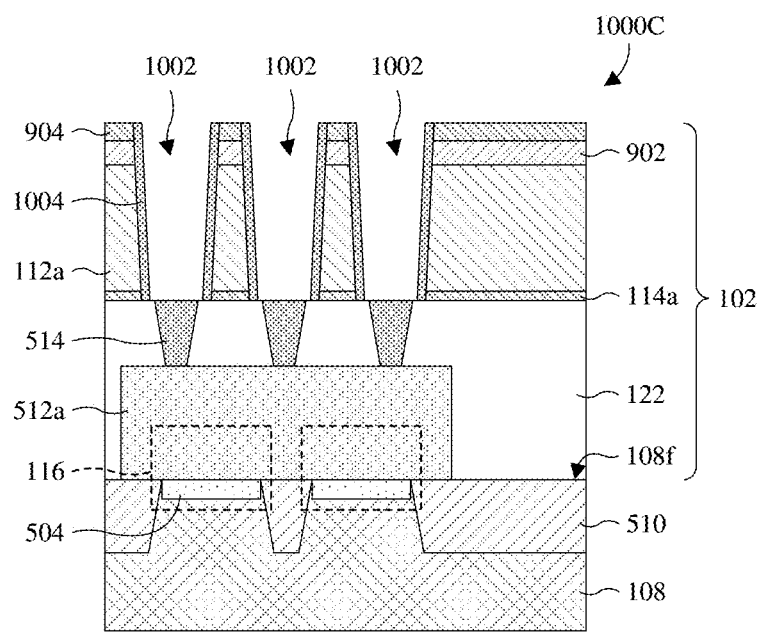

As illustrated by the cross-sectional view 1000C of FIG. 10C, the sacrificial layer 1004 is etched back. The etching back removes the sacrificial layer 1004 from atop the first and second hard mask layers 902, 904 and further removes the sacrificial layer 1004 from atop the interlayer vias 514. Further, the etching back localizes the sacrificial layer 1004 to sidewalls of the wire openings 1002. The etching back may, for example, be performed by a dry etch and/or some other suitable type of etch.

Figure 10D:
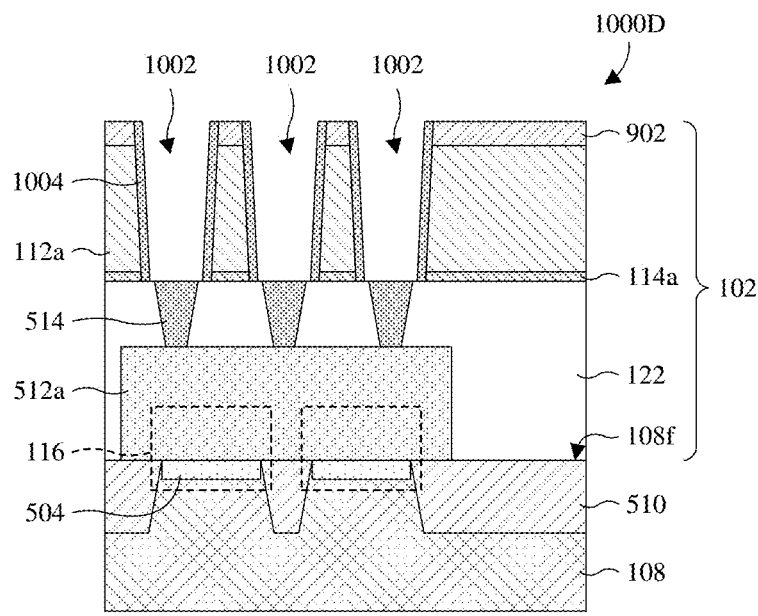

As illustrated by the cross-sectional view 1000D of FIG. 10D, the second hard mask layer 904 is removed. The removal also recesses a top surface of the sacrificial layer 1004. The removal may, for example, be performed by etching or by some other suitable removal process. Further, to the extent that the removal is performed by etching, the first hard mask layer 902 may, for example, serve as an etch stop. In alternative embodiments, the removal is skipped.

Figure 10E:
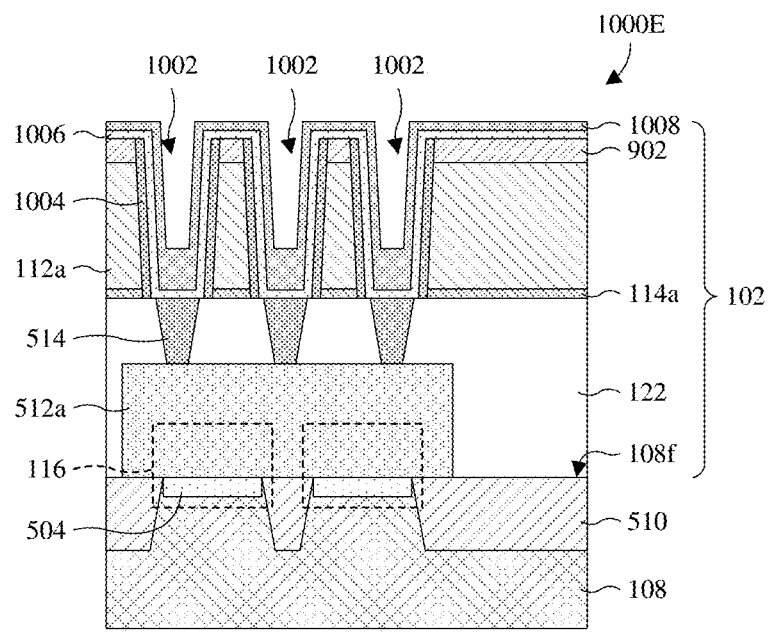

As illustrated by the cross-sectional view 1000E of FIG. 10E, a barrier layer 1006 is deposited over the first hard mask layer 902 and is further deposited lining and partially filling the wire openings 1002. In alternative embodiments, the barrier layer 1006 is omitted. The barrier layer 1006 serves as a diffusion barrier for material of a seed layer 1008 hereafter formed and, in some embodiments, further serves as an adhesion layer for the seed layer 1008. The barrier layer 1006 may, for example, be or comprise titanium nitride, tantalum nitride, some other suitable barrier material(s) for the seed layer 1008, or any combination of the foregoing.

Also illustrated by the cross-sectional view 1000E of FIG. 10E, a seed layer 1008 is deposited over the barrier layer 1006 and is further deposited lining and partially filling the wire openings 1002. As seen hereafter, the seed layer 1008 serves as a seed for depositing a plug layer hereafter described. In alternative embodiments, the seed layer 1008 is omitted and the plug layer is deposited without the seed layer 1008. The seed layer 1008 may, for example, be or comprise copper, aluminum, aluminum copper, some other suitable material(s), or any combination of the foregoing. Further, the seed layer 1008 may, for example, be deposited by atomic layer deposition (ALD) and/or some other suitable deposition process(es).

Figure 10F:
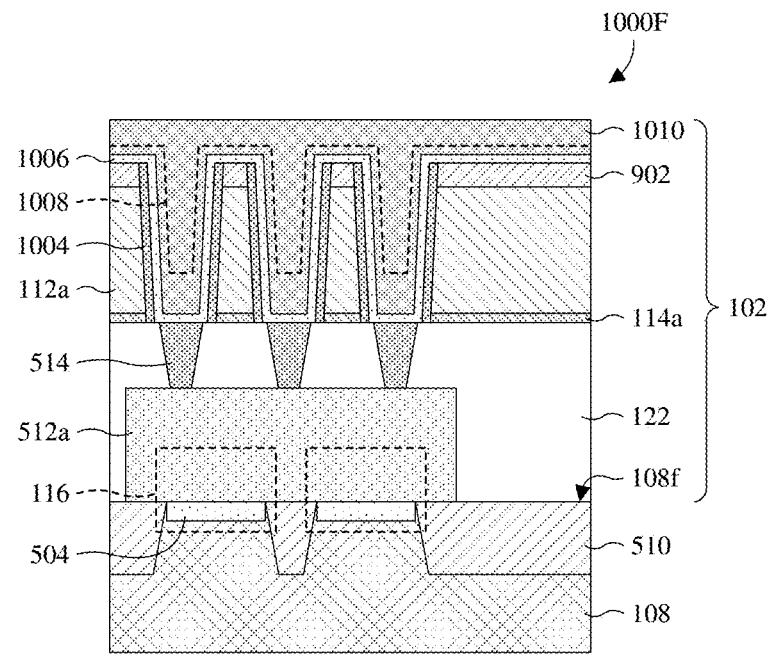

As illustrated by the cross-sectional view 1000F of FIG. 10F, a plug layer 1010 is deposited filling a remainder of the wire openings 1002 and covering the barrier layer 1006. The plug layer 1010 is the same material as, or otherwise comprises the material of, the seed layer 1008 (see, e.g., FIG. 10E). For example, the plug layer 1010 and the seed layer 1008 may be or comprise copper and/or some other suitable material(s). Further, during the deposition, the plug layer 1010 grows from and subsumes the seed layer 1008. The deposition may, for example, be performed by electrochemical plating (ECP), electroless plating, some other suitable deposition process(es), or any combination of the foregoing.

As seen above, FIGS. 10A-10F illustrate the sacrificial layer 1004 as being deposited (see, e.g., FIG. 10B) before the second hard mask layer 904 is removed (see, e.g., FIG. 10D). In alternative embodiments, illustrated hereafter by FIGS. 11A-11G, the sacrificial layer 1004 is deposited (see, e.g., FIG. 11D) after the second hard mask layer 904 is removed (see, e.g., FIG. 11B). Thus, in first embodiments of the method, the method proceeds from FIGS. 8 and 9 to FIGS. 10A-10F and from FIGS. 10A-10F to FIGS. 12-22 while skipping FIGS. 11A-11G. Further, in second embodiments of the method, the method proceeds from FIGS. 8 and 9 to FIGS. 11A-11G, while skipping FIGS. 10A-10F, and from FIGS. 11A-11G to FIGS. 12-22.

Figure 11A:
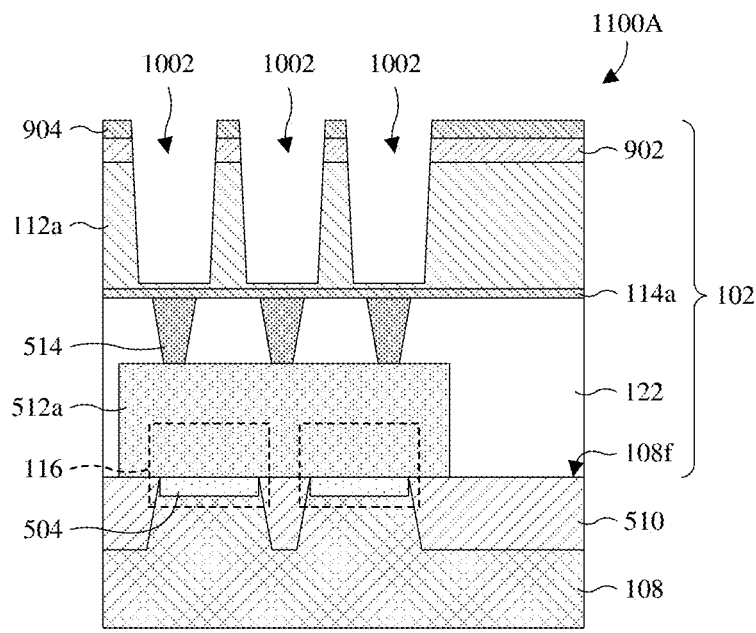

As illustrated by the cross-sectional view 1100A of FIG. 11A, the first IMD layer 112a is etched with the first and second hard mask layers 902, 904 in place and stops before reaching the first ESL 114a. The etching transfers a pattern of the first and second hard mask layers 902, 904 to the first IMD layer 112a and forms wire openings 1002 respectively overlying the interlayer vias 514. The etching may, for example, be performed by a dry etch, a wet etch, or some other suitable type of etch.

Figure 11B:
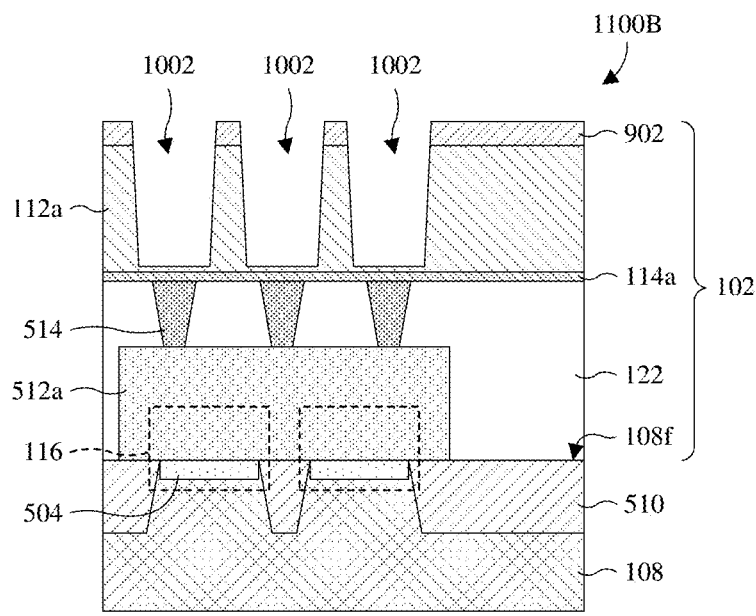

As illustrated by the cross-sectional view 1100B of FIG. 11B, the second hard mask layer 904 is removed. The removal may, for example, be performed by etching or by some other suitable removal process. Further, to the extent that the removal is performed by etching, the first hard mask layer 902 may, for example, serve as an etch stop.

Figure 11C:
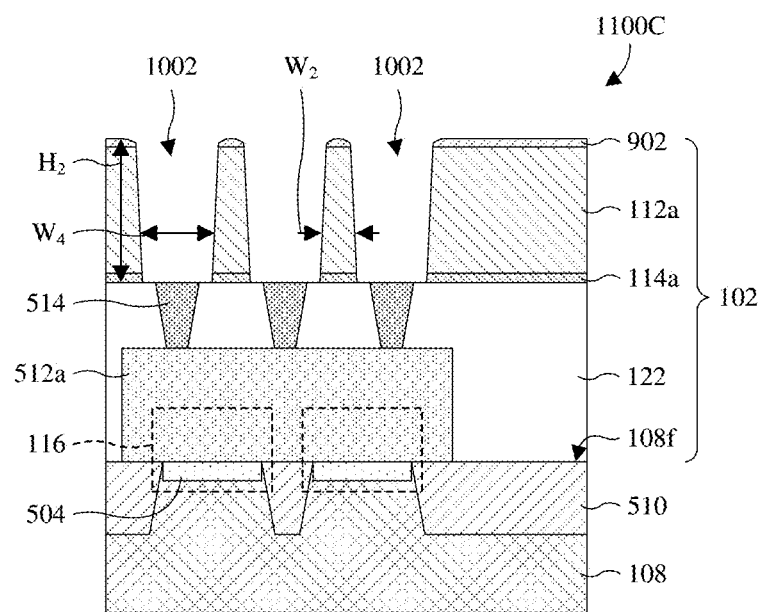
Figure 11D:
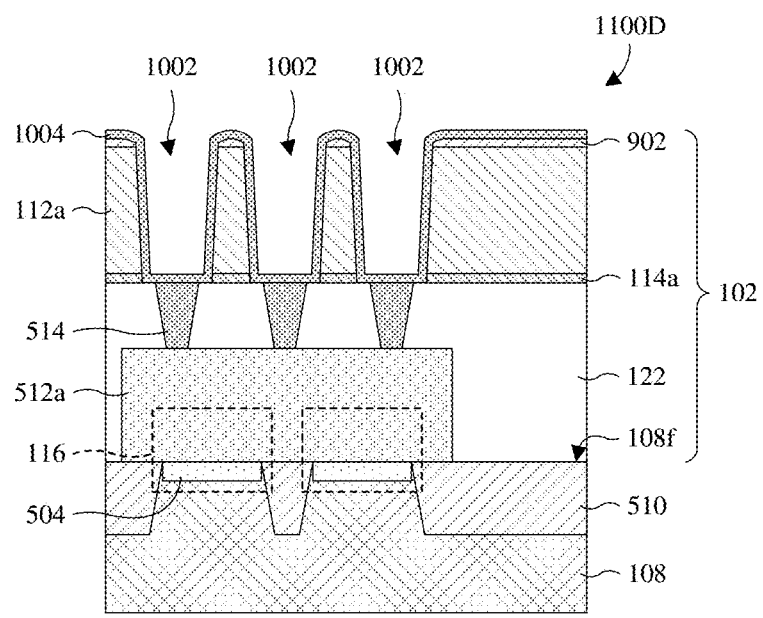
Figure 11E:
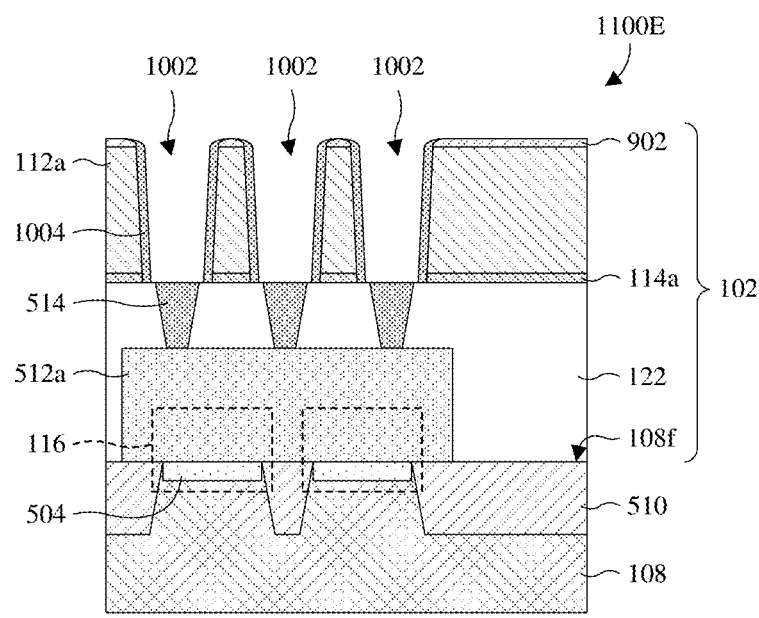
Figure 11F:
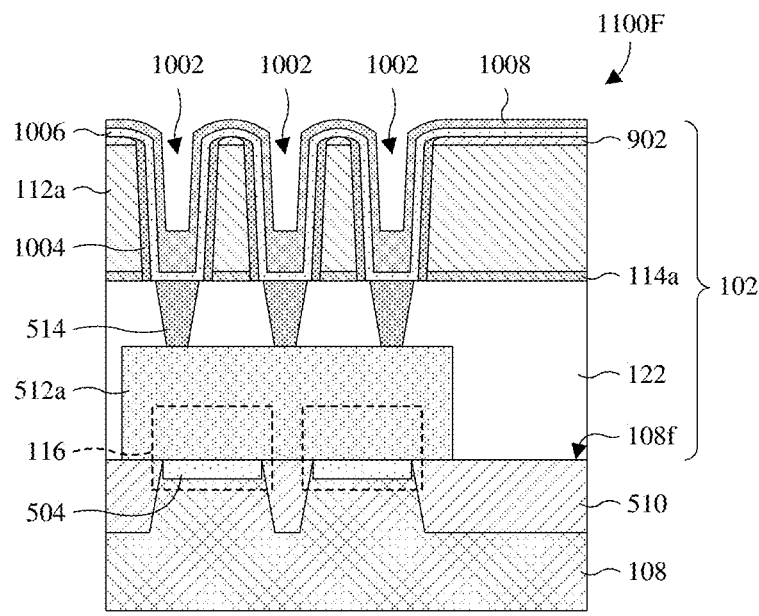

As illustrated by the cross-sectional view 1100C of FIG. 11C, the first IMD layer 112a, the first hard mask layer 902, and the first ESL 114a are etched. The etching thins the first hard mask layer 902 and rounds corners of the first hard mask layer 902. Further, the etching extends the wire openings 1002 through the first ESL 114a to respectively expose the interlayer vias 514. The etching may, for example, be performed by a dry etch, a wet etch, or some other suitable type of etch.

In some embodiments, the wire openings 1002 have a ratio of height $H_2$ to width $W_4$ (e.g., an aspect ratio) that is about 1.8-2.5, about 1.8-2.15, about 2.15-2.5, or some other suitable value. If the ratio is too high (e.g., above about 2.5 or some other value), a sacrificial layer hereafter described may not be fully removed (e.g., at FIG. 13). In some embodiments, the first IMD layer 112a has a width $W_2$ separating the wire openings 1002 for each neighboring pair of wire openings 1002. The width $W_2$ may, for example, be about 5 nanometers, about 1-10 nanometers, or some other suitable value.

As illustrated by the cross-sectional views 1100D-1100G of FIGS. 11D-11G, the acts described with regard to FIGS. 10B, 10C, 10E, and 10F are respectively performed. At FIG.

11D, the sacrificial layer 1004 is deposited lining the wire openings 1002 and covering the first hard mask layer 902 as described with regard to FIG. 10B. At FIG. 11E, the sacrificial layer 1004 is etched back as described with regard to FIG. 10C. At FIG. 11F, a barrier layer 1006 and a seed layer 1008 are deposited lining the wire openings 1002 as described with regard to FIG. 10E. At FIG. 11G, a plug layer 1010 is deposited filling a remainder of the wire openings 1002 and covering the barrier layer 1006 as described with regard to FIG. 10F. Because corners of the first hard mask layer 902 are rounded by the etching at FIG. 11C, the barrier layer 1006, the seed layer 1008, and the plug layer 1010 are better able to fill the wire openings 1002. For example, gaps are less likely to form in the plug layer 1010. As a result, the process window (e.g., process resiliency) for forming the wires 106 in the wire openings 1002 is enlarged.

Figure 11G:
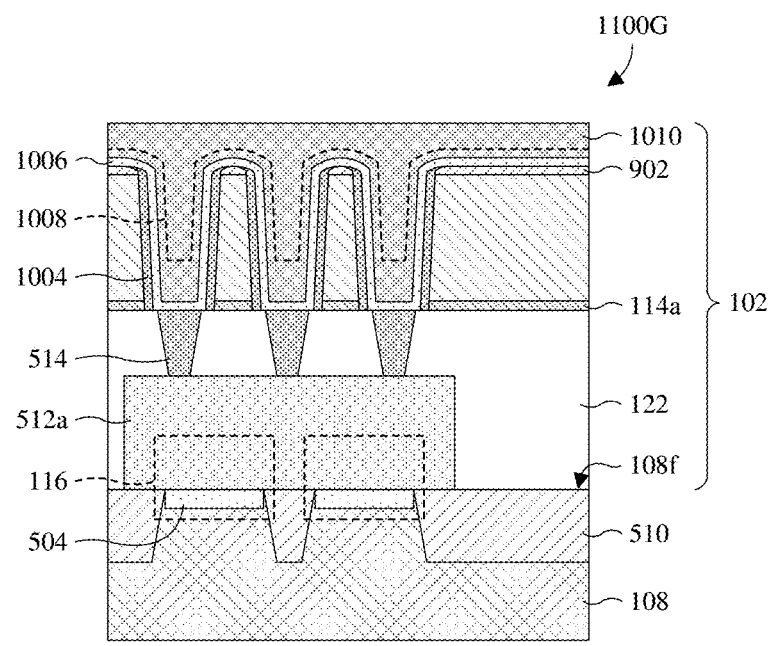
Figure 12:
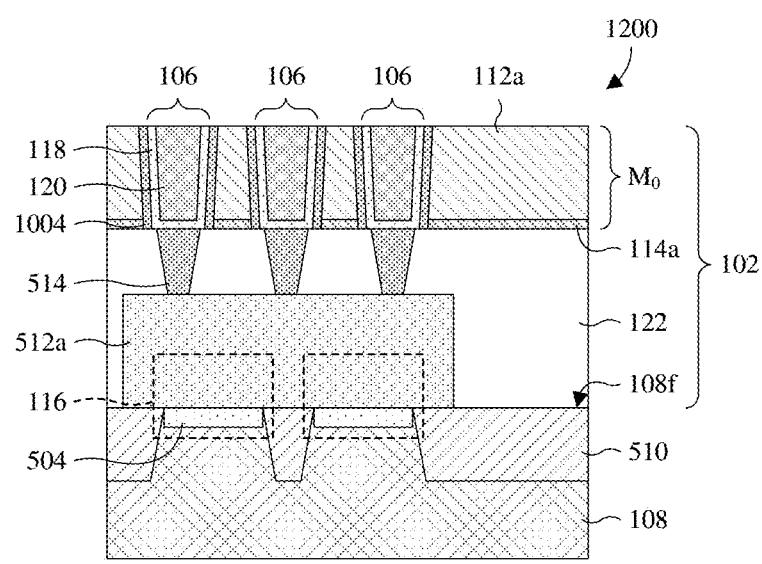

As illustrated by the cross-sectional view 1200 of FIG. 12, a planarization is performed. As described above, FIGS. 10A-10F and FIGS. 11A-11G correspond to alternative embodiments of the method. Therefore, the planarization may be performed on the structure of FIG. 10F or the structure of FIG. 11G.

The planarization removes the barrier layer 1006 (see, e.g., FIG. 10F or 11G) and the plug layer 1010 (see, e.g., FIG. 10F or 11G) from atop the first hard mask layer 902 and further removes the first hard mask layer 902 (see, e.g., FIG. 10F or 11G). Further, the planarization thins the first IMD layer 112a, recesses a top surface of the sacrificial layer 1004, and forms a plurality of wires 106 at a zeroth wire level $M_0$ of the interconnect structure 102. The wires 106 comprise individual barrier liners 118 and individual plugs 120 respectively formed from the barrier layer 1006 and the plug layer 1010. The planarization may, for example, be performed by a chemical mechanical polish (CMP) and/or some other suitable planarization process.

Figure 13:
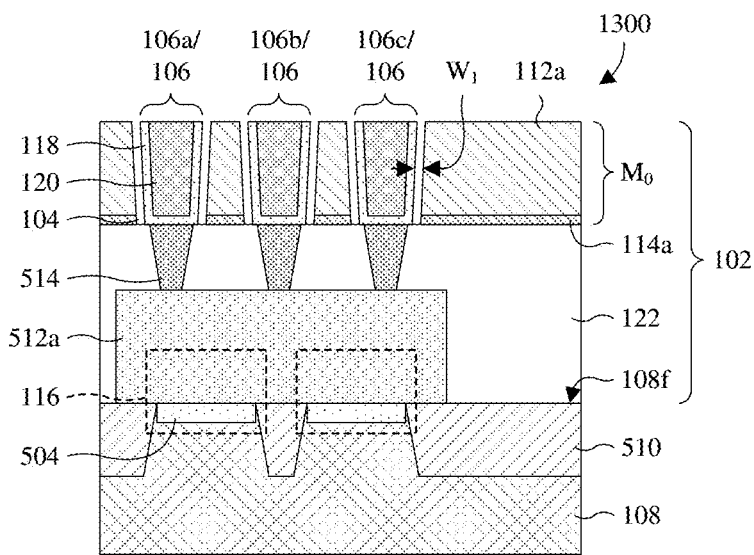

As illustrated by the cross-sectional view 1300 of FIG. 13, the sacrificial layer 1004 (see, e.g., FIG. 12) is etched to remove the sacrificial layer 1004 and to form cavities 104 in place of the sacrificial layer 1004. The cavities 104 are electrically insulating and have a dielectric constant less than the first IMD layer 112a. For example, the cavities 104 may have a dielectric constant of about 1 when filled with air, whereas the first IMD layer 112a may be an ELK dielectric having a dielectric constant of about 1.8-2.0. Other suitable gases and/or dielectric constants are, however, amenable. In some embodiments, the cavities 104 are individual to the wires 106 and each extends in a closed path to surround the individual wire when viewed top down. Non-limiting examples are in FIGS. 3A and 3B. Further, in some embodiments, the cavities 104 have a width $W_1$ that is about 15 angstroms, about 10-20 angstroms, or some other suitable value.

The etching is performed with an etchant having a high etch rate (e.g., high selectivity) for the sacrificial layer 1004 relative to the first IMD layer 112a and, in some embodiments, the first ESL 114a and/or and the interlayer vias 514. The high etch rate may, for example, be an etch rate that is about 1.5-3 times, or some other suitable multiple, greater than an etch rate for the layer/structure (e.g., the first IMD layer 112a) to which it is compared. The etching may, for example, be performed by wet etching, dry etching, or some other suitable type of etching. In alternative embodiments, the etching is skipped, such that the sacrificial layer 1004 persists to the final structure of the IC. In such alternative embodiments, the sacrificial layer 1004 is dielectric and has a dielectric constant less than the first IMD layer 112a.

Upon completion of the etching, the wires 106 and the cavities 104 may, for example, have layouts as in any of FIGS. 3A and 3B. Further, because the cavities 104 and the first IMD layer 112a separate the wires 106, instead of just the first IMD layer 112a separating the wires 106, overall (e.g., average) dielectric constants between the wires 106 are reduced. This, in turn, reduces parasitic capacitances between the wires 106. For example, parasitic capacitance between a first wire 106a and a second wire 106b that neighbors the first wire 106a is reduced. As another example, parasitic capacitance between the second wire 106b and a third wire 106c that neighbors the second wire 106b is reduced. By reducing parasitic capacitance, RC delay is reduced and hence performance of the IC is increased.

Figure 14:
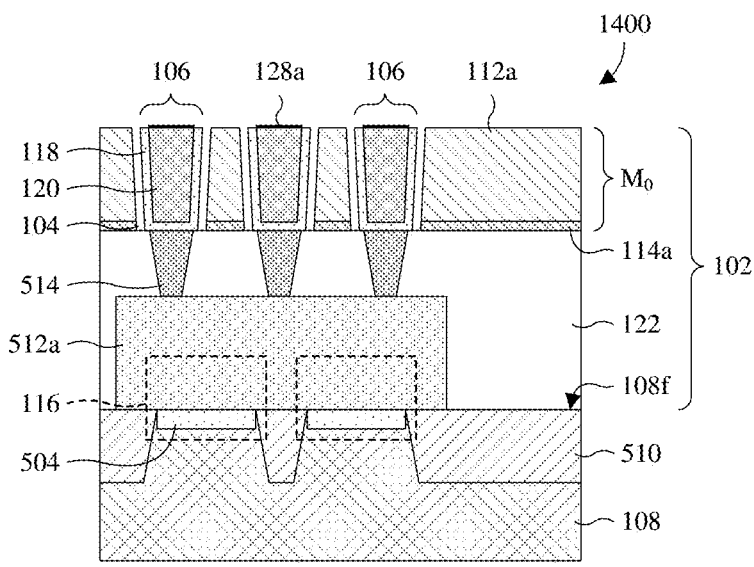
Figure 15:
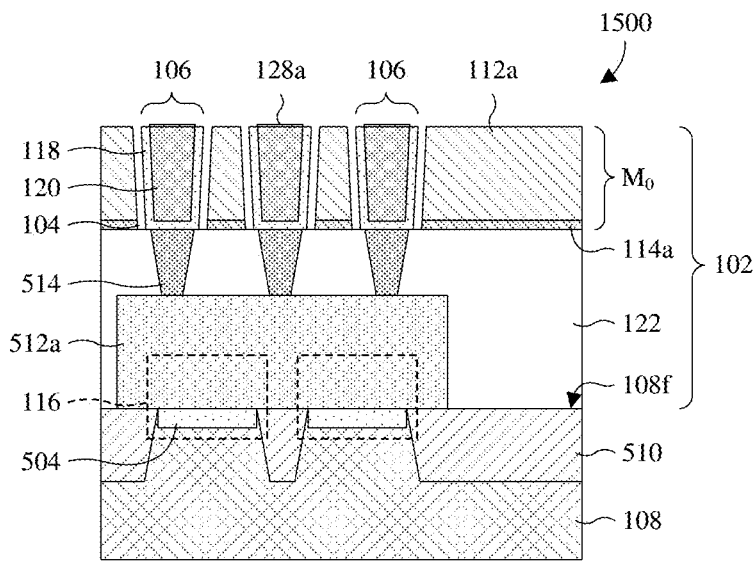
Figure 16:
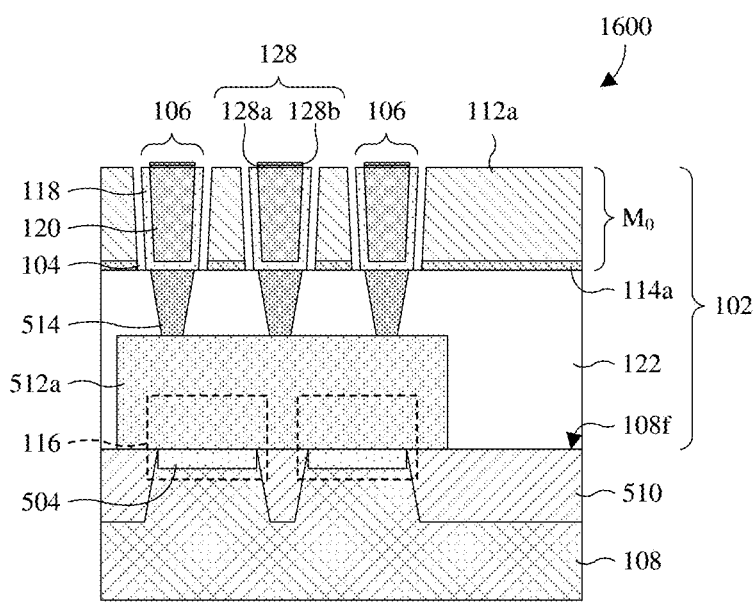

As illustrated by the cross-sectional views 1400-1600 of FIGS. 14-16, a plurality of wire caps 128 is formed on the wires 106. In alternative embodiments, the wire caps 128 are not formed.

In the cross-sectional view 1400 of FIG. 14, a first cap layer 128a is selectively deposited, such that the first cap layer 128a preferentially deposits on the plugs 120 but does not deposit, or minimally deposits, on the barrier liners 118 and the first IMD layer 112a. The first cap layer 128a is conductive and may, for example, be or comprise cobalt and/or some other suitable metal(s). In some embodiments, the first cap layer 128a is or comprises cobalt and plugs 120 are or comprise copper. In alternative embodiments, the first cap layer 128a is some other suitable material and/or the plugs 120 are some other suitable material.

In the cross-sectional view 1500 of FIG. 15, the first cap layer 128a is treated to remove or otherwise reduce impurities on the first cap layer 128a. The impurities may, for example, include oxide and/or some other suitable impurities. The treatment may, for example, comprise exposing the first cap layer 128a to ammonia (e.g., $NH_3$) gas and/or ammonia plasma, but other suitable gases and/or treatment processes are amenable.

In the cross-sectional view 1600 of FIG. 16, the acts described with regard to FIGS. 14 and 15 are repeated to selectively deposit and treat a second cap layer 128b over the first cap layer 128a. In alternative embodiments, the acts described with regard to FIGS. 14 and 15 are repeated multiple times to form multiple cap layers, including the second cap layer 128b, stacked over the first cap layer 128a. The selective deposition of the second cap layer 128b is the same as the first cap layer 128a, except that the second cap layer 128b preferentially deposits on the first cap layer 128a but does not deposit, or minimally deposits, on the barrier liners 118 and the first IMD layer 112a. Collectively, the first and second cap layers 128a, 128b define wire caps 128 individual to and respectively on the wires 106.

Figure 17:
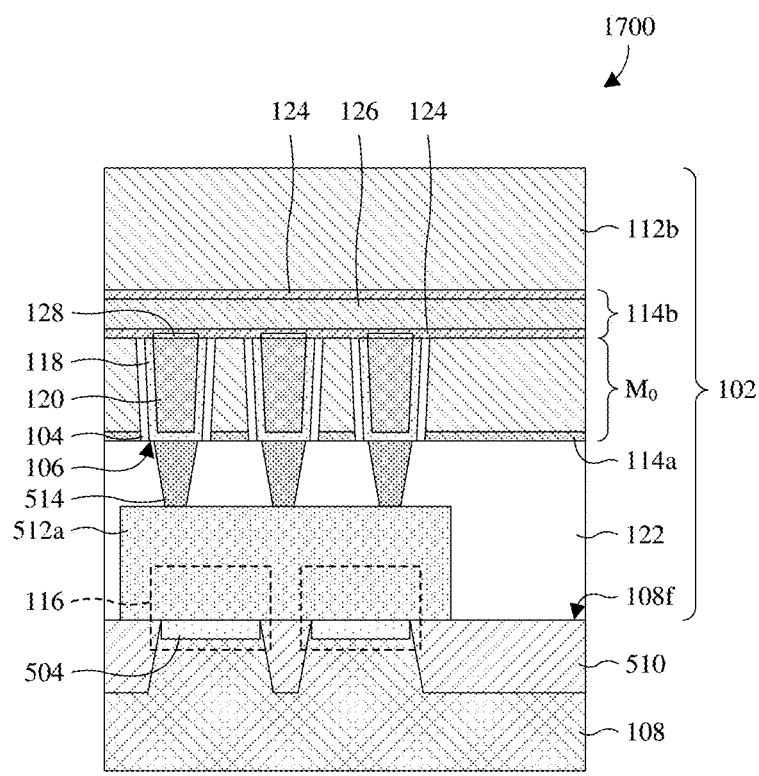

As illustrated by the cross-sectional view 1700 of FIG. 17, a second ESL 114b and a second IMD layer 112b are deposited over the first IMD layer 112a and the wire caps 128. In alternative embodiments, the second ESL 114b protrudes into the cavities 104 as illustrated in FIG. 4A. The second IMD layer 112b overlies the second ESL 114b and may, for example, be as the first IMD layer 112a is described. The second ESL 114b may, for example, be or comprise silicon oxide, silicon nitride, some other suitable dielectric(s), or any combination of the foregoing. In some embodiments, the second ESL 114b comprises a pair of outer layers 124 sharing a first material and further comprises an intermediate layer 126 between the outer layers 124 and having a second material. The first material may, for example, be or comprise silicon nitride or some other suitable material, whereas the second material may, for example, be or comprise silicon oxide or some other suitable material, or vice versa As illustrated by the cross-sectional view 1800 of FIG. 18, one or more inter-wire vias 502 and one or more additional wires 106 are formed in the second ESL 114b and the second IMD layer 112b to respectively define a zeroth via level $V_0$ and a first wire level $M_1$. The inter-wire via(s) 502 and the additional wire(s) 106 are formed together by a dual damascene process. In some embodiments, the dual damascene process comprises: 1) patterning the second IMD layer 112b to form one or more first openings with a layout of the additional wire(s) 106; 2) patterning the second IMD layer 112b and the second ESL 114b with a layout of the inter-wire via(s) 502; 3) depositing one or more conductive layers filling the first and second openings; and 4) performance a planarization into the conductive layer(s). In other embodiments, the dual damascene process comprises some other suitable series of acts.

In alternative embodiments, the inter-wire via(s) 502 and the additional wire(s) 106 are formed separately by single damascene processes. In such alternative embodiments, only the inter-wire via(s) 502 are formed in the second ESL 114b and the second IMD layer 112b. Further, the acts of FIGS. 9, 10A-10F, and 12 or the acts of FIGS. 9, 11A-11G, and 12 are thereafter repeated to form the additional wire(s) 106 over the inter-wire via(s) 502. In alternative embodiments, instead of repeating the acts of FIGS. 9, 10A-10F, and 12 or the acts of FIGS. 9, 11A-11G, and 12 to form the additional wire(s) 106, the acts of FIGS. 17 and 18 are repeated to form the additional wire(s) 106.

Figure 18:
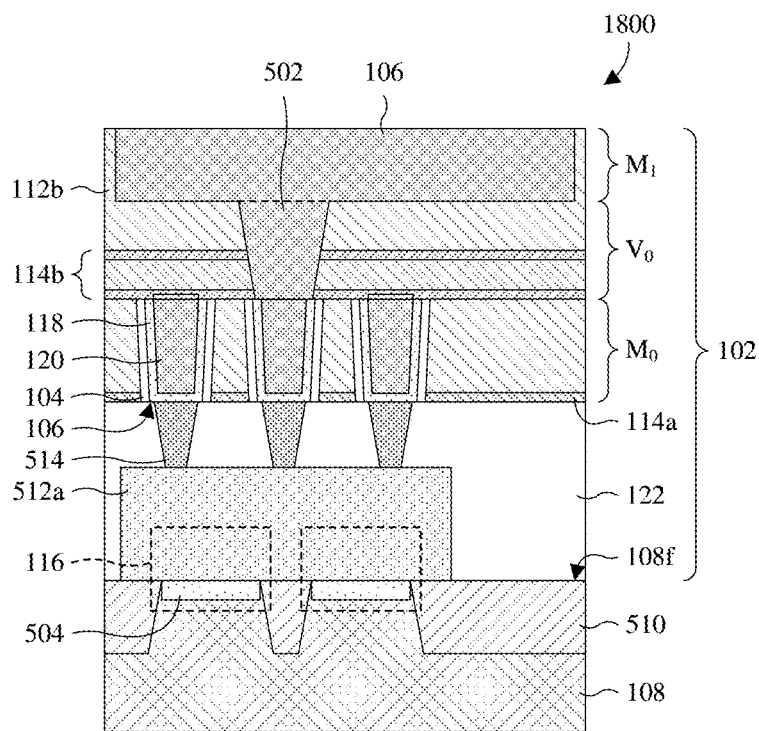
Figure 19:
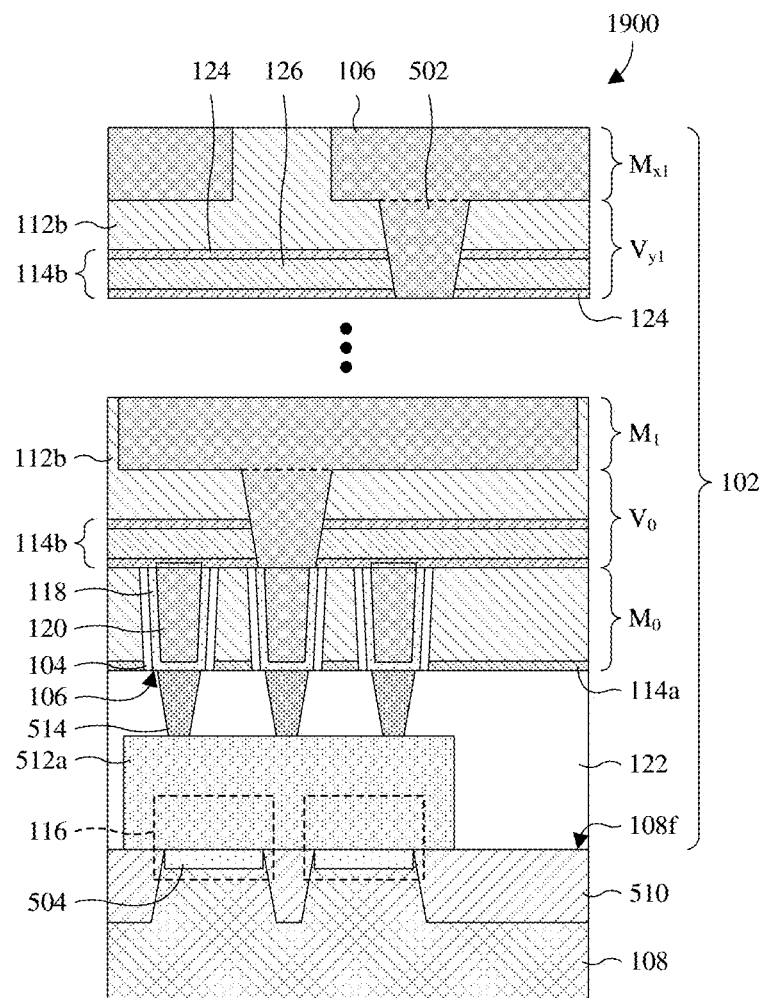

As illustrated by the cross-sectional view 1900 of FIG. 19, the acts described with regard to FIGS. 17 and 18 are repeated one or more times to form one or more additional via levels and one or more additional wire levels over the first wire level $M_1$. The ellipses are employed to represent zero or more additional via levels and zero or more additional wire levels. As a result of repeating the acts described with regard to FIGS. 17 and 18, wire level $M_{x1}$ and via level $V_{y1}$ are along a top of the interconnect structure 102, where x1 and y1 correspond to integers respectively greater than one and zero.

Figure 20:
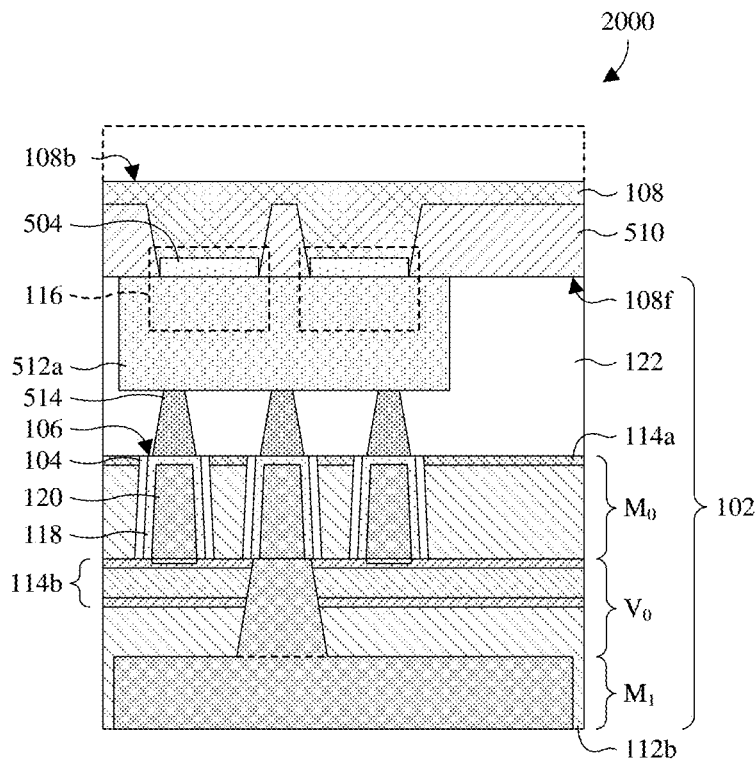

As illustrated by the cross-sectional view 2000 of FIG. 20, the structure of FIG. 19 is flipped vertically and the substrate 108 is thinned from a backside 108b of the substrate 108, thereby removing a portion of the substrate 108 (shown in phantom). Note that for ease of illustration, only a portion of the interconnect structure 102 from the substrate 108 to the first wire level $M_1$ is illustrated. A remainder of the interconnect structure 102 is as shown in FIG. 19. The thinning may, for example, be performed by a planarization, an etch, some other suitable thinning process, or any combination of the foregoing.

Figure 21:
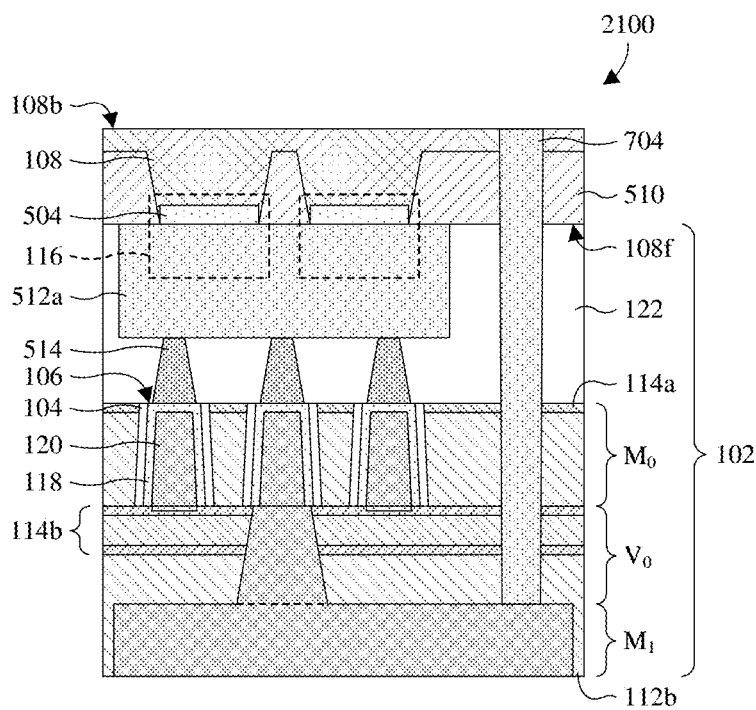

As illustrated by the cross-sectional view 2100 of FIG. 21, a TSV 704 is formed extending through the substrate 108, the ILD layer 122, the zeroth wire level $M_0$, and the zeroth via level $V_0$ to the first wire level $M_1$. In alternative embodiments, the TSV 704 extends to the zeroth wire level $M_0$ or some other suitable wire level. A process for forming the TSV 704 may, for example, comprise: 1) patterning the structure of FIG. 20 from the backside 108b of the substrate 108 to form an opening exposing the first wire level $M_1$; 2) depositing a conductive layer filling the opening; and 3) performing a planarization into the conductive layer. Other suitable processes are, however, amenable.

Figure 22:
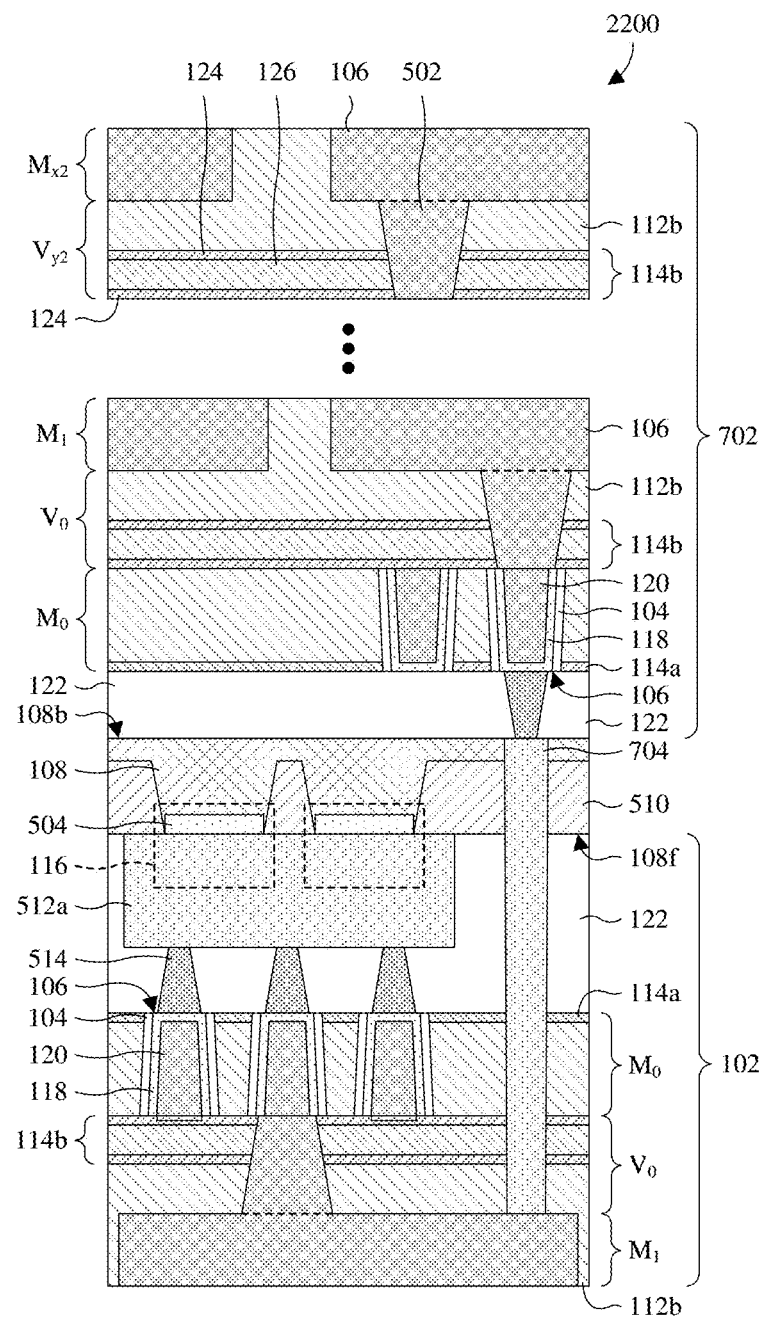

As illustrated by the cross-sectional view 2200 of FIG. 22, the acts described with regard to FIGS. 9, 10A-10F, and 12-19 or the acts described with regard to FIGS. 9, 11A-11G, and 12-19 are repeated on the backside 108b of the substrate 108, with a few exceptions identified hereafter, to form an additional interconnect structure 702 electrically coupled to the interconnect structure 102 by the TSV 704. Amongst the exceptions, semiconductor devices and AR contacts are not formed as described with regard to FIG. 8. Further, the acts described with regard to FIG. 19 are performed so the additional interconnect structure 702 has wire level $M_{x2}$ and via level $V_{y2}$, instead of wire level $M_{x1}$ and via level $V_{y1}$, along a top of the additional interconnect structure 702. x2 and y2 correspond to integers respectively greater than one and zero. x2 may, for example, be the same as or different than x1, and y2 may, for example be the same as or different than y1.

While FIGS. 8, 9, 10A-10F, 11A-11G, and 12-22 are described with reference to a method, it will be appreciated that the structures shown in FIGS. 8, 9, 10A-10F, 11A-11G, and 12-22 are not limited to the method but rather may stand alone separate of the method. While FIGS. 8, 9, 10A-10F, 11A-11G, and 12-22 are described as a series of acts, it will be appreciated that the order of the acts may be altered in other embodiments. While FIGS. 8, 9, 10A-10F, 11A-11G, and 12-22 illustrate and describe as a specific set of acts, some acts that are illustrated and/or described may be omitted in other embodiments. Further, acts that are not illustrated and/or described may be included in other embodiments.

Figure 23:
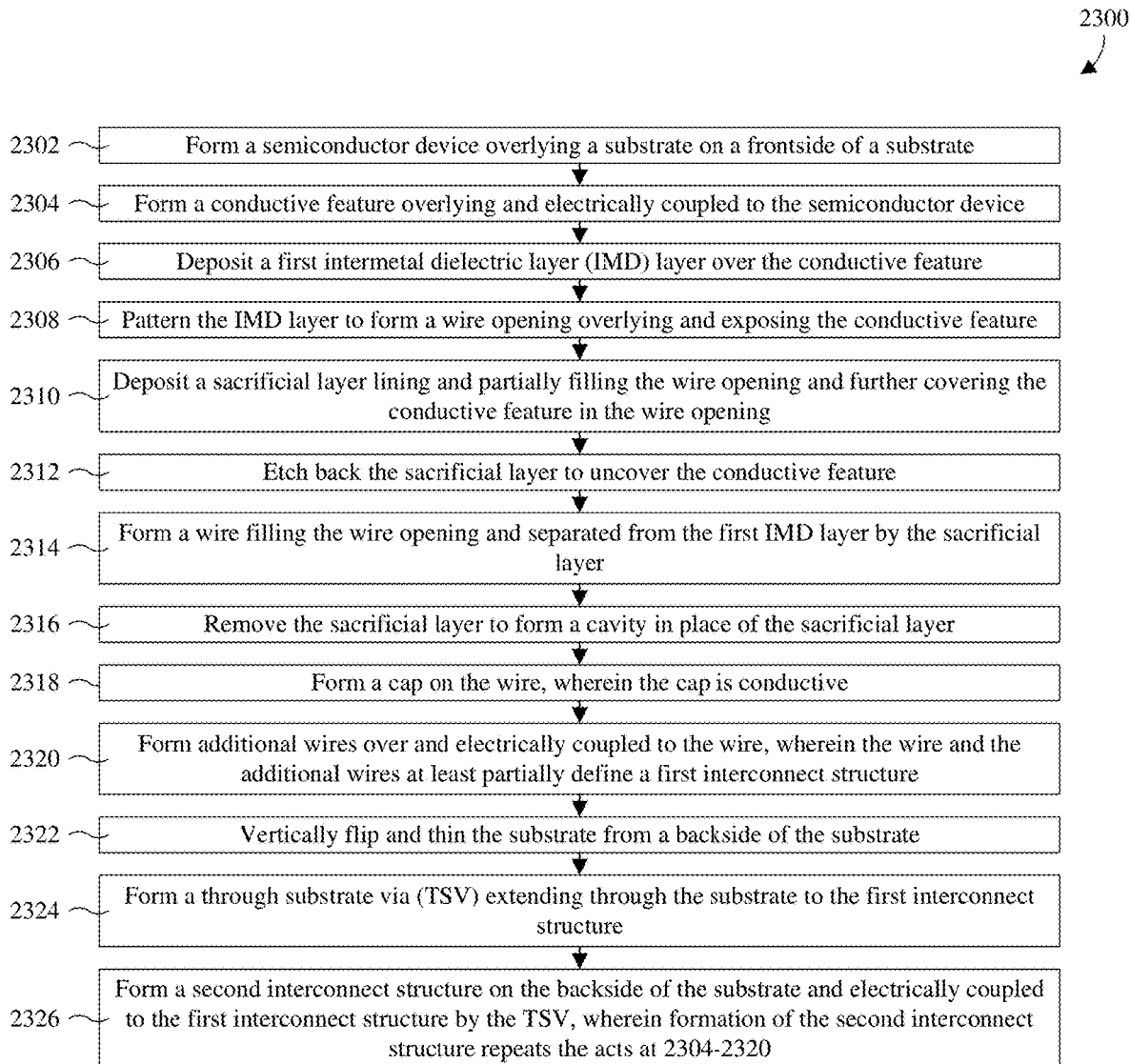
FIG. 23 illustrates a block diagram of some embodiments of the method of FIGS. 8, 9, 10A-10F, 11A-11G, and 12-22.

With reference to FIG. 23, a block diagram 2300 of some embodiments of the method of FIGS. 8, 9, 10A-10F, 11A-11G, and 12-22 is provided.

At 2302, a semiconductor device is formed overlying a substrate on a frontside of a substrate. See, for example, FIG. 8.

At 2304, a conductive feature is formed overlying and electrically coupled to the semiconductor device. See, for example, FIG. 8. The conductive feature may, for example, be one of the interlayer vias 514 in FIG. 8 or some other suitable conductive feature.

At 2306, a first IMD layer is deposited over the conductive feature. See, for example, FIG. 9.

At 2308, the IMD layer is patterned to form a wire opening overlying and exposing the conductive feature. See, for example, FIGS. 9 and 10A or FIGS. 9 and 11A-1C. As noted above, FIGS. 10A-10F and FIGS. 11A-11G are alternatives of each other.

At 2310, a sacrificial layer is deposited lining and partially filling the wire opening and further covering the conductive feature in the wire opening. See, for example, FIG. 10B or FIG. 11D.

At 2312, the sacrificial layer is etched back to uncover the conductive feature. See, for example, FIG. 10C or FIG. 11E.

At 2314, a wire is formed filling the wire opening and separated from the first IMD layer by the sacrificial layer. See, for example, FIGS. 10E, 10F, and 12 or FIGS. 11F, 11G, and 12.

At 2316, the sacrificial layer is removed to form a cavity in place of the sacrificial layer. See, for example, FIG. 13.

At 2318, a cap is formed on the wire, wherein the cap is conductive. See, for example, FIGS. 14-16.

At 2320, additional wires are formed over and electrically coupled to the wire, wherein the wire and the additional wires at least partially define a first interconnect structure. See, for example, FIGS. 17-19.

At 2322, the substrate is vertically flipped and thinned from a backside of the substrate. See, for example, FIG. 20.

At 2324, a TSV is formed extending through the substrate to the first interconnect structure. See, for example, FIG. 21.

At 2326, a second interconnect structure is formed on the backside of the substrate and electrically coupled to the first interconnect structure by the TSV, wherein formation of the second interconnect structure repeats the acts at 2304-2320. See, for example, FIG. 22.

While the block diagram 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an IC including: a substrate; a conductive feature overlying the substrate; a first dielectric layer overlying the conductive feature; a metal wire overlying and bordering the conductive feature in the first dielectric layer; a second dielectric layer overlying the metal wire and the first dielectric layer; and a cavity between opposing sidewalls respectively of the metal wire and the first dielectric layer, wherein the opposing sidewalls are in the cavity. In some embodiments, the cavity and the opposing sidewalls extend in individual closed paths around the metal wire. In some embodiments, the conductive feature is a via, wherein IC further includes a contact underlying the via and extending from the substrate to the via, wherein the contact is laterally elongated. In some embodiments, the IC further includes a plurality of metal wires and a plurality of metal vias, wherein the metal wires and the metal vias are respectively grouped into a plurality of wire levels and a plurality of via levels, wherein the wire levels and the via levels are alternatingly stacked over the substrate, and wherein a zeroth wire level of the plurality of wire levels includes the metal wire and is closest to the substrate amongst the plurality of wire levels. In some embodiments, the IC further includes a semiconductor device overlying and partially defined by the substrate, wherein the semiconductor device is between the substrate and the conductive feature. In some embodiments, the IC further include: a semiconductor device underlying and partially defined by the substrate, wherein the substrate is between the semiconductor device and the conductive feature. In some embodiments, the IC further includes: an additional metal wire overlying the metal wire in the second dielectric layer, wherein a sidewall of the additional metal wire directly contacts the second dielectric layer; and a metal via extending from the additional metal wire to the metal wire.

In some embodiments, the present disclosure provides another IC including: a substrate; a semiconductor device overlying and partially defined by the substrate; an interconnect structure overlying and electrically coupled to the semiconductor device, wherein the interconnect structure includes a plurality of wires and a plurality of vias, wherein the wires and the vias are respectively grouped into a plurality of wire levels and a plurality of via levels that are alternatingly stacked over the substrate, and wherein a first wire level of the plurality of wire levels includes a first wire and a second wire neighboring the first wire; a first IMD layer separating the first and second wires; and a first dielectric region separating and adjoining opposing sidewalls respectively of the IMD layer and the first wire, wherein the first dielectric region has a smaller dielectric constant than the IMD layer. In some embodiments, the first dielectric region has a ring-shaped layout extending in a closed path around the first wire. In some embodiments, the first dielectric region is an air gap. In some embodiments, the first wire level is closest to the substrate amongst the plurality of wire levels. In some embodiments, the IC further includes a second dielectric region separating and adjoining additional opposing sidewalls respectively of the IMD layer and the second wire, wherein the second dielectric region is independent of the first dielectric region. In some embodiments, the plurality of wires includes a third wire over the first and second wires, wherein the IC further includes: a plurality of additional wires under the substrate and including a first additional wire; a TSV extending through the substrate from the first additional wire to the third wire; a second IMD layer having a sidewall facing the first additional wire; and a cavity separating the sidewall from the first additional wire, wherein the sidewall and the first additional wire are in the cavity. In some embodiments, the first wire includes copper, wherein the IC further includes: a cobalt cap overlying and directly on a top surface of the first wire.

In some embodiments, the present disclosure provides a method including: forming a conductive feature overlying a substrate; depositing a first dielectric layer over the conductive feature; patterning the first dielectric layer to form an opening exposing the conductive feature; forming a sacrificial layer partially filling the opening and on a sidewall of the first dielectric layer; forming a first metal wire filling a remainder of the opening while the sacrificial layer remains in place on the sidewall of the first dielectric layer; and removing the sacrificial layer to form a cavity in place of the sacrificial layer. In some embodiments, the forming of the sacrificial layer includes: deposing the sacrificial layer lining the sidewall of the first dielectric layer in the opening and further covering the conductive feature; and etching back the sacrificial layer to uncover the conductive feature while the sacrificial layer remains on the sidewall of the first dielectric layer. In some embodiments, the forming of the first metal wire includes: depositing a barrier layer partially filling and lining the opening; depositing a metal layer filling a remainder of the opening over the barrier layer; and performing a planarization into the barrier layer and a metal layer, wherein the first metal wire is defined by a portion of the barrier layer and a portion of metal layer in the opening after the planarization. In some embodiments, the method further includes forming a cobalt cap overlying and directly on a top surface of the first metal wire. In some embodiments, the forming of the cobalt cap includes performing a plurality of deposition/treatment cycles, wherein each of the deposition/treatment cycles includes depositing cobalt and treating the deposited cobalt with ammonia. In some embodiments, the method further includes: forming a plurality of semiconductor devices overlying the substrate; and forming a contact overlying and directly contacting the semiconductor devices, wherein the conductive feature is a via overlying and directly contacting the contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) comprising:
a substrate;
a conductive feature overlying the substrate;
a first dielectric layer over the conductive feature;
a metal wire overlying and bordering the conductive feature in the first dielectric layer;
a second dielectric layer overlying the metal wire and the first dielectric layer;
a cavity between opposing sidewalls respectively of the metal wire and the first dielectric layer, wherein the opposing sidewalls are in the cavity; and
a metal cap overlying and directly contacting the metal wire, wherein the metal cap is spaced from the cavity.

2. The IC according to claim 1, wherein the cavity and the opposing sidewalls extend in individual closed paths around the metal wire.

3. The IC according to claim 1, wherein the conductive feature is a via, and wherein the IC further comprises:
a contact underlying the via and extending from the substrate to the via, wherein the contact is laterally elongated.

4. The IC according to claim 1, further comprising:
a plurality of metal wires and a plurality of metal vias, wherein the metal wires and the metal vias are respectively grouped into a plurality of wire levels and a plurality of via levels, wherein the wire levels and the via levels are alternatingly stacked over the substrate, and wherein a zeroth wire level of the plurality of wire levels includes the metal wire and is closest to the substrate amongst the plurality of wire levels.

5. The IC according to claim 1, further comprising:
a semiconductor device overlying and partially defined by the substrate, wherein the semiconductor device is between the substrate and the conductive feature.

6. The IC according to claim 1, further comprising:
a semiconductor device underlying and partially defined by the substrate, wherein the substrate is between the semiconductor device and the conductive feature.

7. The IC according to claim 1, further comprising:
an additional metal wire overlying the metal wire in the second dielectric layer, wherein a sidewall of the additional metal wire directly contacts the second dielectric layer; and
a metal via extending from the additional metal wire to the metal wire.

8. An integrated circuit (IC) comprising:
a substrate;
a semiconductor device overlying and partially defined by the substrate, and further comprising a gate electrode with a bottom surface facing the substrate in a first direction;
an interconnect structure electrically coupled to the semiconductor device and comprising a plurality of wires and a plurality of vias, wherein the wires and the vias are respectively grouped into a plurality of wire levels and a plurality of via levels that overlie the gate electrode and that are alternatingly stacked away from the gate electrode in a second direction opposite the first direction, and wherein a first wire level of the plurality of wire levels includes a first wire and a second wire neighboring the first wire;
a first intermetal dielectric (IMD) layer separating the first and second wires; and
a first cavity separating and adjoining opposing sidewalls respectively of the IMD layer and the first wire, wherein the first cavity has a smaller dielectric constant than the IMD layer.

9. The IC according to claim 8, wherein the first cavity has a ring-shaped layout extending in a closed path around the first wire.

10. The IC according to claim 8, wherein the first wire comprises a metal plug and a barrier liner layer wrapping around a bottom of the metal plug, and wherein the IC further comprises an etch stop layer overlying and contacting the barrier liner layer while being spaced from the metal plug and exposed in the first cavity.

11. The IC according to claim 10, wherein a bottom surface of the first cavity is elevated relative to a bottom surface of the first wire in the second direction.

12. The IC according to claim 8, wherein the first wire level is closest to the substrate amongst the plurality of wire levels.

13. The IC according to claim 8, further comprising:
a second cavity separating and adjoining additional opposing sidewalls respectively of the IMD layer and the second wire, wherein the second cavity is independent of the first cavity.

14. The IC according to claim 8, wherein the plurality of wires comprises a third wire over the first and second wires, and wherein the IC further comprises:
a plurality of additional wires under the substrate and comprising a first additional wire;
a through substrate via (TSV) extending through the substrate from the first additional wire to the third wire;
a second IMD layer having a sidewall facing the first additional wire; and
a second cavity separating the sidewall from the first additional wire, wherein the sidewall and the first additional wire are in the second cavity.

15. The IC according to claim 8, wherein the first wire comprises copper, and wherein the IC further comprises:
a cobalt cap overlying and directly on a top surface of the first wire.

16. An integrated circuit (IC) comprising:
a substrate;
a conductive feature overlying the substrate;
a dielectric layer over the conductive feature;
a metal wire overlying and bordering the conductive feature in the dielectric layer;
a cavity between opposing sidewalls respectively of the metal wire and the dielectric layer, wherein the opposing sidewalls are in the cavity; and
a through substrate via (TSV) extending completely through the substrate, wherein the metal wire is level with the TSV.

17. The IC according to claim 16, further comprising:
a transistor partially defined by the substrate and comprising a gate electrode, wherein the gate electrode has a top surface facing the metal wire in a first direction and a bottom surface facing the substrate in a second direction opposite the first direction.

18. The IC according to claim 16, further comprising:
a second conductive feature separating the conductive feature from the substrate.

19. The IC according to claim 16, further comprising:
a second metal wire overlying the metal wire; and
a via extending from the second metal wire to the metal wire;
wherein the TSV extends to the second metal wire.

20. The IC according to claim 16, further comprising:
a second conductive feature underlying the substrate;
a second dielectric layer under the conductive feature;
a second metal wire underlying and bordering the second conductive feature in the second dielectric layer; and
a second cavity between opposing sidewalls respectively of the second metal wire and the second dielectric layer, which are in the second cavity.

* * * * *